US011361995B2

(12) United States Patent
Choi et al.

(10) Patent No.: US 11,361,995 B2
(45) Date of Patent: Jun. 14, 2022

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Seung-Hoon Choi, Yongin-si (KR); Ja-Eung Koo, Yongin-si (KR); Kwan-Sik Kim, Seoul (KR); Dong-Chan Kim, Suwon-si (KR); Il-Young Yoon, Hwaseong-si (KR); Man-Geun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/146,597

(22) Filed: Jan. 12, 2021

(65) Prior Publication Data
US 2021/0166976 A1 Jun. 3, 2021

Related U.S. Application Data

(63) Continuation of application No. 16/295,751, filed on Mar. 7, 2019, now Pat. No. 10,910,266.

(30) Foreign Application Priority Data

Aug. 20, 2018 (KR) .................. 10-2018-0096790

(51) Int. Cl.
*H01L 21/768* (2006.01)
*H01L 21/321* (2006.01)
(Continued)

(52) U.S. Cl.
CPC .... *H01L 21/76898* (2013.01); *H01L 21/3212* (2013.01); *H01L 21/76831* (2013.01);
(Continued)

(58) Field of Classification Search
CPC .......... H01L 21/76898; H01L 21/3212; H01L 21/76831
See application file for complete search history.

(56) References Cited

U.S. PATENT DOCUMENTS 6,335,287 B1 1/2002 Hwang et al.
6,465,351 B1 10/2002 Jeong
(Continued)

FOREIGN PATENT DOCUMENTS

KR 1998-054478 9/1998
KR 10-0902580 6/2009
KR 10-1087391 11/2011

*Primary Examiner* — Omar F Mojaddedi
(74) *Attorney, Agent, or Firm* — F. Chau & Associates, LLC

(57) ABSTRACT

A method of manufacturing a semiconductor device includes forming a via including a first conductive material on an inner wall of a trench on a substrate. The method further includes forming a first insulating interlayer on the substrate. The first insulating interlayer covers the via and partially fills the trench, and the first insulating interlayer has a non-flat upper surface. The method further includes forming a polishing stop layer on the first insulating interlayer, forming a second insulating interlayer on the polishing stop layer, in which the second insulating interlayer fills a remaining portion of the trench, planarizing the second insulating interlayer until the polishing stop layer is exposed, and etching the polishing stop layer and the first and second insulating interlayers using a dry etching process until remaining portions of the polishing stop layer except for a portion of the polishing stop layer in the trench are removed.

20 Claims, 21 Drawing Sheets

(51) Int. Cl.
    *H01L 27/146*     (2006.01)
    *H01L 23/52*     (2006.01)
    *H01L 23/522*     (2006.01)
    *H01L 23/528*     (2006.01)
    *H01L 23/48*     (2006.01)
    *H01L 27/30*     (2006.01)

(52) U.S. Cl.
    CPC ........ *H01L 23/481* (2013.01); *H01L 23/5226* (2013.01); *H01L 23/5283* (2013.01); *H01L 27/307* (2013.01); *H01L 27/1462* (2013.01); *H01L 27/1463* (2013.01); *H01L 27/14636* (2013.01); *H01L 27/14689* (2013.01)

(56) References Cited

U.S. PATENT DOCUMENTS

| | | | |
|---|---|---|---|
| 7,485,540 B2 | 2/2009 | Chinthakindi et al. | |
| 2012/0001286 A1* | 1/2012 | Yoon | H01L 27/14685 |
| | | | 257/E31.127 |
| 2014/0263962 A1* | 9/2014 | Ahn | H01L 27/1464 |
| | | | 250/208.1 |
| 2015/0255495 A1* | 9/2015 | Park | H01L 27/14621 |
| | | | 257/446 |
| 2015/0372036 A1* | 12/2015 | Suh | H01L 27/14625 |
| | | | 257/432 |
| 2016/0204142 A1* | 7/2016 | Um | H01L 27/1463 |
| | | | 257/446 |
| 2016/0225813 A1 | 8/2016 | Liao et al. | |
| 2016/0276169 A1 | 9/2016 | Zhong | |
| 2016/0300871 A1* | 10/2016 | Borthakur | H01L 27/14607 |
| 2016/0300962 A1* | 10/2016 | Borthakur | H01L 27/14636 |
| 2017/0170238 A1* | 6/2017 | Lee | H01L 27/14612 |
| 2020/0058549 A1 | 2/2020 | Choi et al. | |

\* cited by examiner

FIG. 1
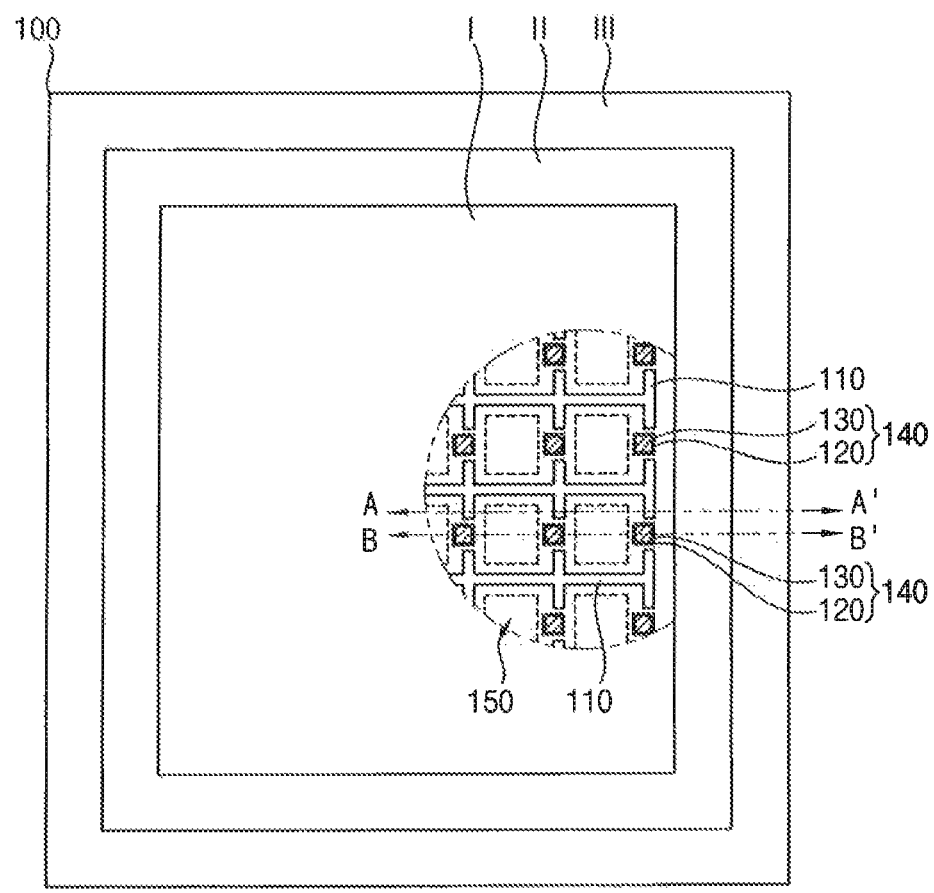
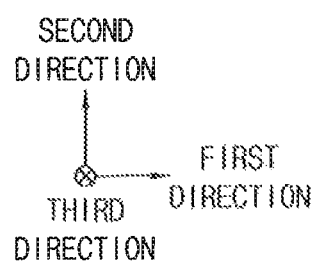

FIG. 14
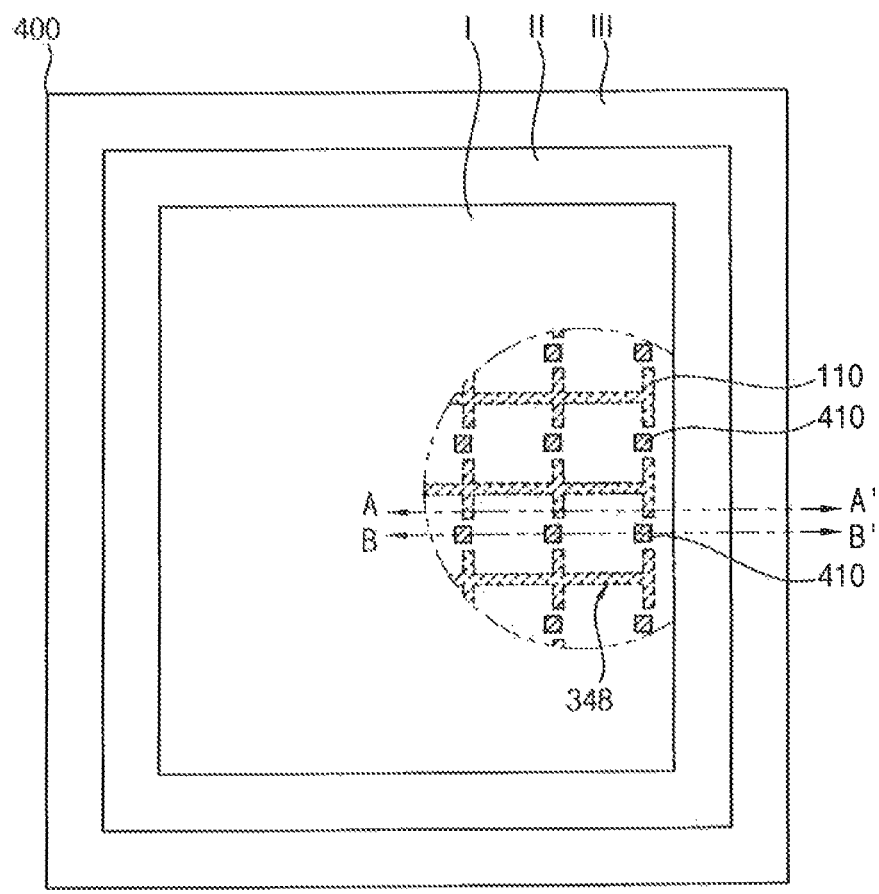
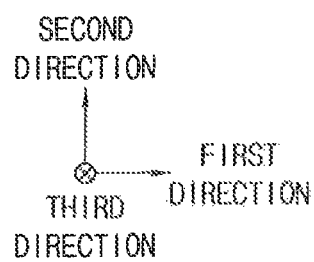

SEMICONDUCTOR DEVICE AND METHOD OF MANUFACTURING THE SAME

CROSS-REFERENCE TO RELATED APPLICATIONS

This application is a continuation application of U.S. patent application Ser. No. 16/295,751, filed on Mar. 7, 2019, which claims priority under 35 U.S.C. § 119 to Korean Patent Application No. 10-2018-0096790, filed on Aug. 20, 2018 in the Korean Intellectual Property Office (KIPO), the contents of which are herein incorporated by reference in their entireties.

TECHNICAL FIELD

Exemplary embodiments of the present inventive concept relate to a semiconductor device and a method of manufacturing the same, and more particularly, to an image sensor and a method of manufacturing the same.

DISCUSSION OF THE RELATED ART

When a CMOS image sensor (CIS) is formed, a trench is formed to form a via contact, a metal layer is deposited on an inner wall of the trench, and an insulation layer is formed to fill a remaining portion of the trench. When the via contact is formed, a pad is also formed. As a result, an upper surface of the insulation layer may be uneven due to the pad, and a planarization process may be required. Since the trench is formed to be wide and deep, an insulating layer having a large thickness may be required to fill the trench. As a result, a height distribution of the insulation layer depending on a position of a wafer may occur in the planarization process (e.g., an upper surface of the insulation layer may be uneven).

SUMMARY

Exemplary embodiments of the present invention may provide a method of manufacturing a semiconductor device having improved characteristics, and a semiconductor device having improved characteristics.

According to an exemplary embodiment of the present inventive concept, a method of manufacturing a semiconductor device includes forming a via including a first conductive material on an inner wall of a trench on a substrate. The method further includes forming a first insulating interlayer on the substrate. The first insulating interlayer covers the via and partially fills the trench, and the first insulating interlayer has a non-flat upper surface. The method further includes forming a polishing stop layer on the first insulating interlayer, forming a second insulating interlayer on the polishing stop layer, in which the second insulating interlayer fills a remaining portion of the trench, planarizing the second insulating interlayer until the polishing stop layer is exposed, and etching the polishing stop layer and the first and second insulating interlayers using a dry etching process until remaining portions of the polishing stop layer except for a portion of the polishing stop layer in the trench are removed.

According to an exemplary embodiment of the present inventive concept, a method of manufacturing a semiconductor device includes forming an opening through a substrate in an input/output region, in which the substrate includes a pixel region and the input/output region, forming a via on an inner wall of the opening, forming an interference prevention pattern on an upper surface of the substrate in the pixel region, and forming a first insulating interlayer on the substrate, in which the first insulating interlayer covers the via and the interference prevention pattern. The method further includes forming a polishing stop layer on the first insulating interlayer, forming a second insulating interlayer on the polishing stop layer, in which the second insulating interlayer fills a remaining portion of the opening, planarizing the second insulating interlayer until the polishing stop layer is exposed, and etching the polishing stop layer and the first and second insulating interlayers using a dry etching process.

According to an exemplary embodiment of the present inventive concept, a method of manufacturing a semiconductor device includes forming a pixel isolation pattern through a substrate in a pixel region, in which the substrate includes the pixel region, an input/output region, a first surface and a second surface disposed opposite to the first surface. The method further includes forming a first insulating interlayer on the first surface of the substrate, in which the first insulating interlayer includes a plurality of wiring structures, forming an opening through the substrate in the input/output region, in which the opening exposes at least one of the wiring structures, forming a via on the exposed at least one of the wiring structures and a sidewall of the opening, forming an interference prevention pattern on an upper surface of the pixel isolation pattern adjacent to the second surface of the substrate, and forming a second insulating interlayer on the second surface of the substrate, in which the second insulating interlayer covers the via and the interference prevention pattern. The method further includes forming a polishing stop layer on the second insulating interlayer, forming a third insulating interlayer on the polishing stop layer, in which the third insulating interlayer fills a remaining portion of the opening, planarizing the third insulating interlayer until the polishing stop layer is exposed, and etching the polishing stop layer and the second and third insulating interlayers using a dry etching process.

According to an exemplary embodiment of the present inventive concept, a semiconductor device includes a substrate including a pixel region and an input/output region, a pixel isolation pattern extending through the substrate in the pixel region, a first via disposed on an inner wall of an opening extending through the substrate in the input/output region, in which the first via includes a first conductive material, and an interference prevention pattern disposed on the pixel isolation pattern, in which the interference prevention pattern includes a second conductive material. The device further includes a first insulating interlayer disposed on the substrate, in which the first insulating interlayer covers the first via and the interference prevention pattern, and in which the first insulating interlayer includes a first portion disposed in the opening and a second portion disposed outside the opening. The first portion includes a concave upper surface, and the second portion includes a substantially flat upper surface. The device further includes a polishing stop pattern disposed on the first portion of the first insulating interlayer, and an insulation pattern disposed on the polishing stop pattern. The insulation pattern fills a remaining portion of the opening, and the insulation pattern includes an upper surface that is substantially coplanar with the upper surface of the second portion of the first insulating interlayer.

According to an exemplary embodiment of the present inventive concept, a semiconductor device includes a substrate including a pixel region, an input/output region, a first surface and a second surface disposed opposite to the first surface. The device further includes a pixel isolation pattern extending through the substrate in the pixel region, and a first insulating interlayer disposed on the first surface of the substrate, in which the first insulating interlayer includes a plurality of wiring structures. The device further includes a via disposed on an inner wall of an opening extending through the substrate in the input/output region and exposing at least one of the wiring structures, in which the via includes a first conductive material. The device further includes an interference prevention pattern disposed on an upper surface of the pixel isolation pattern adjacent to the second surface of the substrate, in which the interference prevention pattern includes a second conductive material. The device further includes a second insulating interlayer disposed on the second surface of the substrate, in which the second insulating interlayer covers the via and the interference prevention pattern. The device further includes a polishing stop pattern disposed on a portion of the second insulating interlayer in the opening, and an insulation pattern disposed on the polishing stop pattern and filling a remaining portion of the opening.

According to an exemplary embodiment of the present inventive concept, a semiconductor device includes a substrate including a pixel region and an input/output region, a pixel isolation pattern extending through the substrate in the pixel region, a first insulating interlayer disposed on the first surface of the substrate and including a plurality of wiring structures, and a first via disposed on an inner wall of an opening extending through the substrate in the input/output region and exposing at least one of the wiring structures, in which the first via includes a first conductive material. The device further includes an interference prevention pattern disposed on an upper surface of the pixel isolation pattern, in which the interference prevention pattern includes a second conductive material, a pad filling a trench on the substrate and including a third conductive material, and a second insulating interlayer disposed on the substrate, in which the second insulating interlayer covers the first via, the pad and the interference prevention pattern. The device further includes a polishing stop pattern disposed on a portion of the second insulating interlayer in the opening, and an insulation pattern disposed on the polishing stop pattern and filling a remaining portion of the opening.

In a semiconductor device according to exemplary embodiments of the present inventive concept, a color filter, an organic photodiode and a microlens disposed in a pixel region may be formed at a uniform height without a height distribution depending on the position thereof. As a result, the semiconductor device including the color filter, the organic photodiode and the microlens may have improved characteristics.

BRIEF DESCRIPTION OF THE DRAWINGS

The above and other features of the present inventive concept will become more apparent by describing in detail exemplary embodiments thereof with reference to the accompanying drawings, in which:

FIGS. 1 to 20 are plan views and cross-sectional views illustrating a method of manufacturing a semiconductor device, and more particularly, an image sensor, according to exemplary embodiments of the present inventive concept.

DETAILED DESCRIPTION OF THE EXEMPLARY EMBODIMENTS

Figure 2:
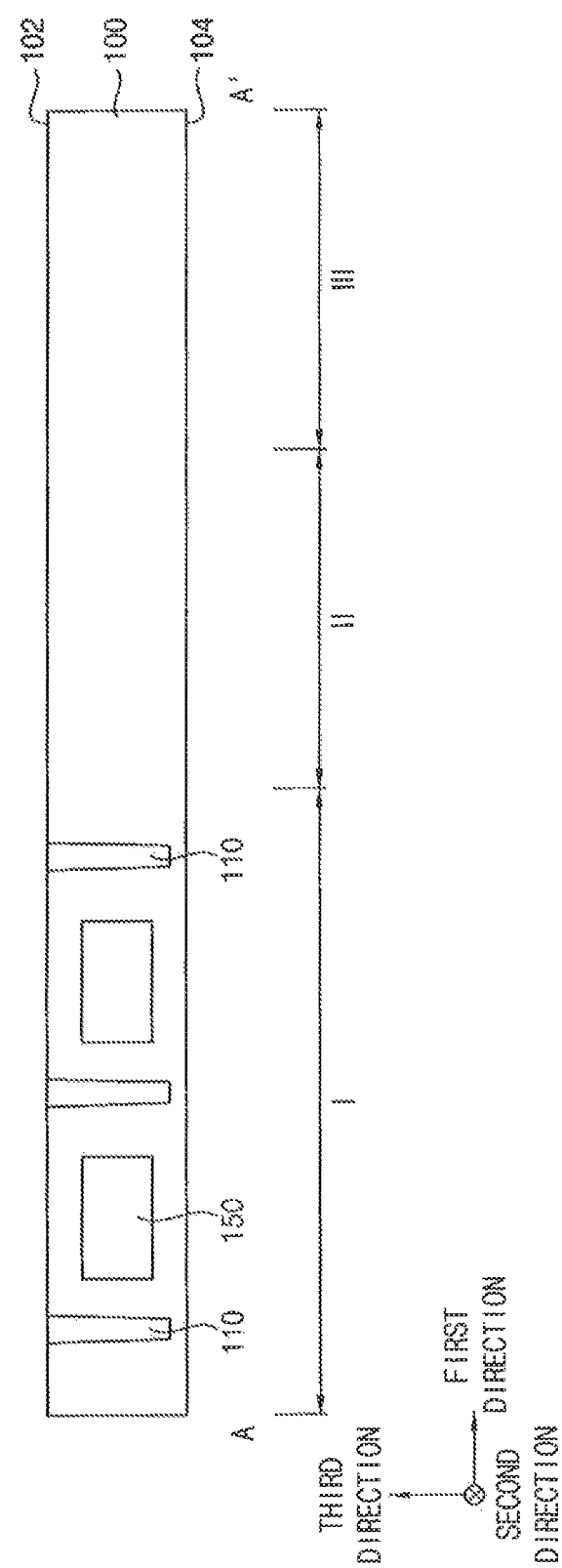

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Herein, when a surface is described as being "substantially" flat, it is to be understood that the surface is exactly flat, or almost/about flat as would be understood by a person having ordinary skill in the art, considering the error associated with measurement of the surface (i.e., the limitations of the measurement system). Similarly, when two or more surfaces are described as being "substantially" coplanar with one another, it is to be understood that the two or more surfaces are exactly coplanar with one another or almost/about coplanar with one another as would be understood by a person having ordinary skill in the art, considering the error associated with measurement of the surfaces (i.e., the limitations of the measurement system).

FIGS. 1 to 20 are plan views and cross-sectional views illustrating a method of manufacturing a semiconductor device, and more particularly, an image sensor, according to exemplary embodiments of the present inventive concept. More particularly, FIGS. 1 and 14 are plan views, and FIGS. 2 to 13 and 15 to 20 are cross-sectional views.

FIGS. 2, 4, 7, 9 to 13, 15 and 19 are cross-sectional views taken along line A-A' of corresponding plan views, and FIGS. 3, 5, 8, 16 to 18 and 20 are cross-sectional views taken along line B-B' of corresponding plan views.

Hereinafter, two directions substantially parallel to an upper surface of a substrate and intersecting with each other are defined as first and second directions, respectively, and a direction substantially vertical to the upper surface of the substrate is defined as a third direction. In exemplary embodiments, the first and second directions may be orthogonal to each other.

Figure 3:
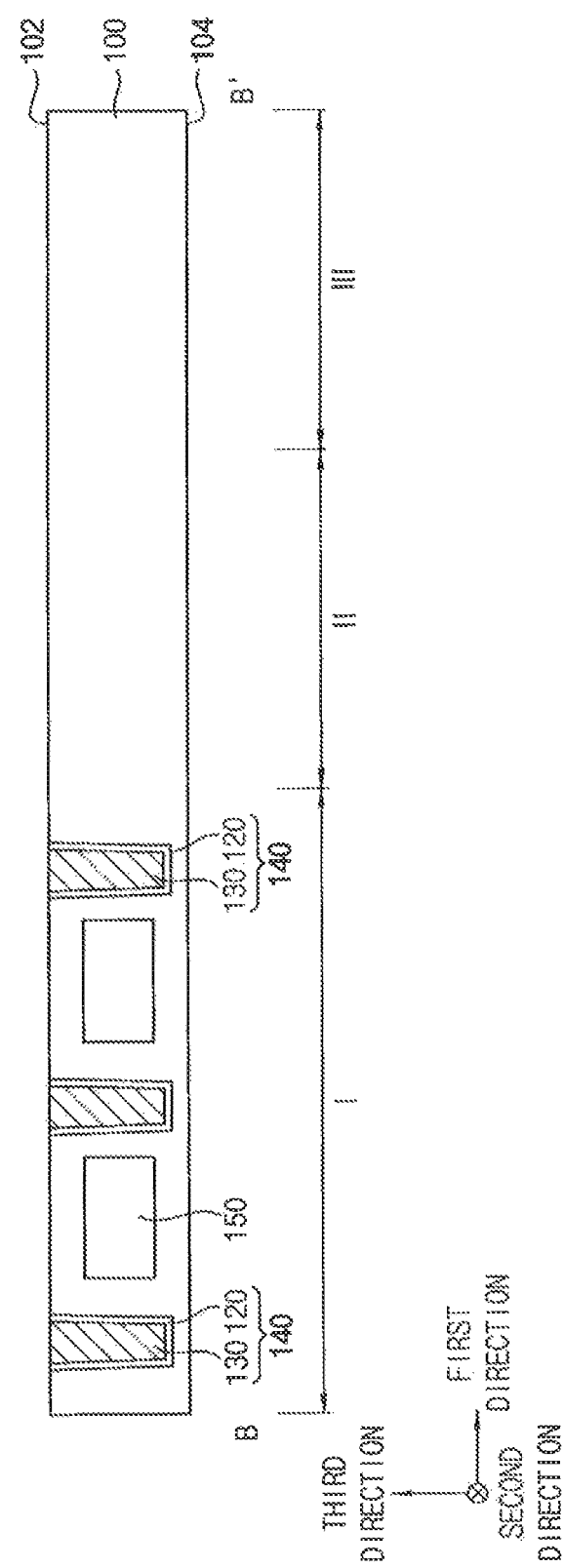

Referring to FIGS. 1 to 3, a pixel isolation pattern 110, a through via 140 and a photodiode 150 may be formed in a first substrate 100. The first substrate 100 includes first to third regions I, II and III.

The first substrate 100 may include semiconductor materials such as, for example, silicon, germanium, silicon-germanium, etc., or III-V compounds such as, for example, GaP, GaAs, GaSb, etc. In exemplary embodiments, the first substrate 100 may be a silicon-on-insulator (SOI) substrate or a germanium-on-insulator (GOI) substrate. In an exemplary embodiment, the first substrate 100 may be doped with p-type impurities.

As shown in FIG. 1, the first region I of the first substrate 100 may have a square or rectangular shape in a plan view, the second region II may surround the first region I, and the third region III may surround the second region II. However, the inventive concept is not limited thereto. Hereinafter, the first to third regions I, II and III may refer not only to an inside of the first substrate 100, but also upper and lower spaces thereof.

In exemplary embodiments, the first region I may be a region in which pixels are formed, the second region I may be a region in which pads for inspecting the electrical characteristics of the pixels are formed, and the third region III may be an input/output (I/O) region in which conductive structures for inputting/outputting electrical signals to/from the pixels are formed. As shown in FIGS. 2 and 3, the first substrate 100 may include a first surface 102 and a second surface 104 opposite thereto.

Herein, the first region I may also be referred to as a pixel region, the second region II may also be referred to as a pad region and the third region III may also be referred to as an input/output region.

The pixel isolation pattern 110 and the through via 140 may be formed by forming a plurality of trenches extending in the third direction downwardly from the first surface 102 within the first region I of the first substrate 100, and filling the trenches, respectively. In exemplary embodiments, in a plan view, the pixel isolation pattern 110 may have a lattice shape in which some portions are cut, and areas cut from the pixel isolation pattern 110 having the lattice shape may be referred to as cutting portions. The through via 140 may be formed at each of the cutting portions of the pixel isolation pattern 110 having the lattice shape to be spaced apart from the pixel isolation pattern 110. The pixel isolation pattern 110 and the through via 140 together may define a region in which a unit pixel may be formed, and a plurality of unit pixel regions may be arranged along each of the first and second directions within the first region I.

In exemplary embodiments, the pixel isolation pattern 110 may include an insulating material such as, for example, oxide or nitride, or a semiconductor material such as, for example, polysilicon. Alternatively, the pixel isolation pattern 110 may include, for example, doped polysilicon, or a conductive material such as, for example, metal, metal nitride, etc.

The through via 140 may include a first insulation layer 120 disposed on an inner wall of the corresponding trench and a first conductive pattern 130 formed on the first insulation layer 120 that fills a remaining portion of the corresponding trench.

In exemplary embodiments, the first insulation layer 120 may include an oxide such as, for example, silicon oxide, metal oxide, etc., or a nitride such as, for example, silicon nitride, and the first conductive pattern 130 may include, for example, doped polysilicon, a metal, a metal nitride, etc.

In an exemplary embodiment, the photodiode 150 may have a structure in which a first impurity region doped with an n-type impurity and a second impurity region doped with a p-type impurity are sequentially stacked. FIGS. 2 and 3 illustrate that the photodiode 150 is formed at a central portion between the first and second surfaces 102 and 104 of the first substrate 100, however, the inventive concept is not limited thereto. For example, the photodiode 150 may extend in the third direction from the first surface 102 of the first substrate 100 toward the second surface 104 of the first substrate 100, and may be spaced apart from each of the first surface 102 and the second surface 104.

An isolation pattern, transistors, and a floating diffusion (FD) region may be further formed at an upper portion of the first substrate 100 adjacent to the first surface 102. The transistors may include, for example, a transfer transistor, a source follower transistor, a reset transistor, and a select transistor. The FD region may be doped with impurities of a conductivity type different from that of the first substrate 100. For example, in an exemplary embodiment, the first substrate 100 may be doped with p-type impurities, and the FD region may be doped with n-type impurities.

Figure 4:
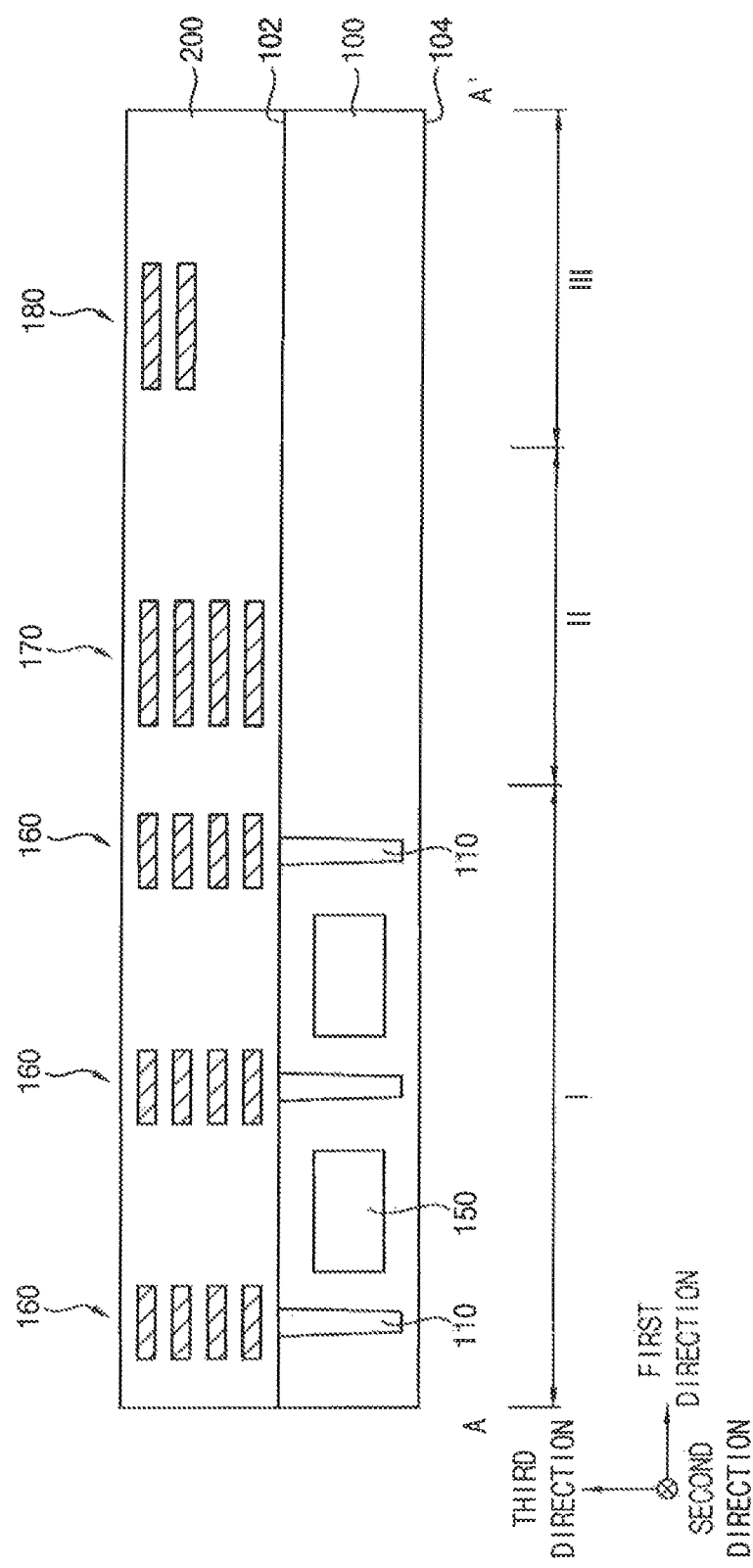
Figure 5:
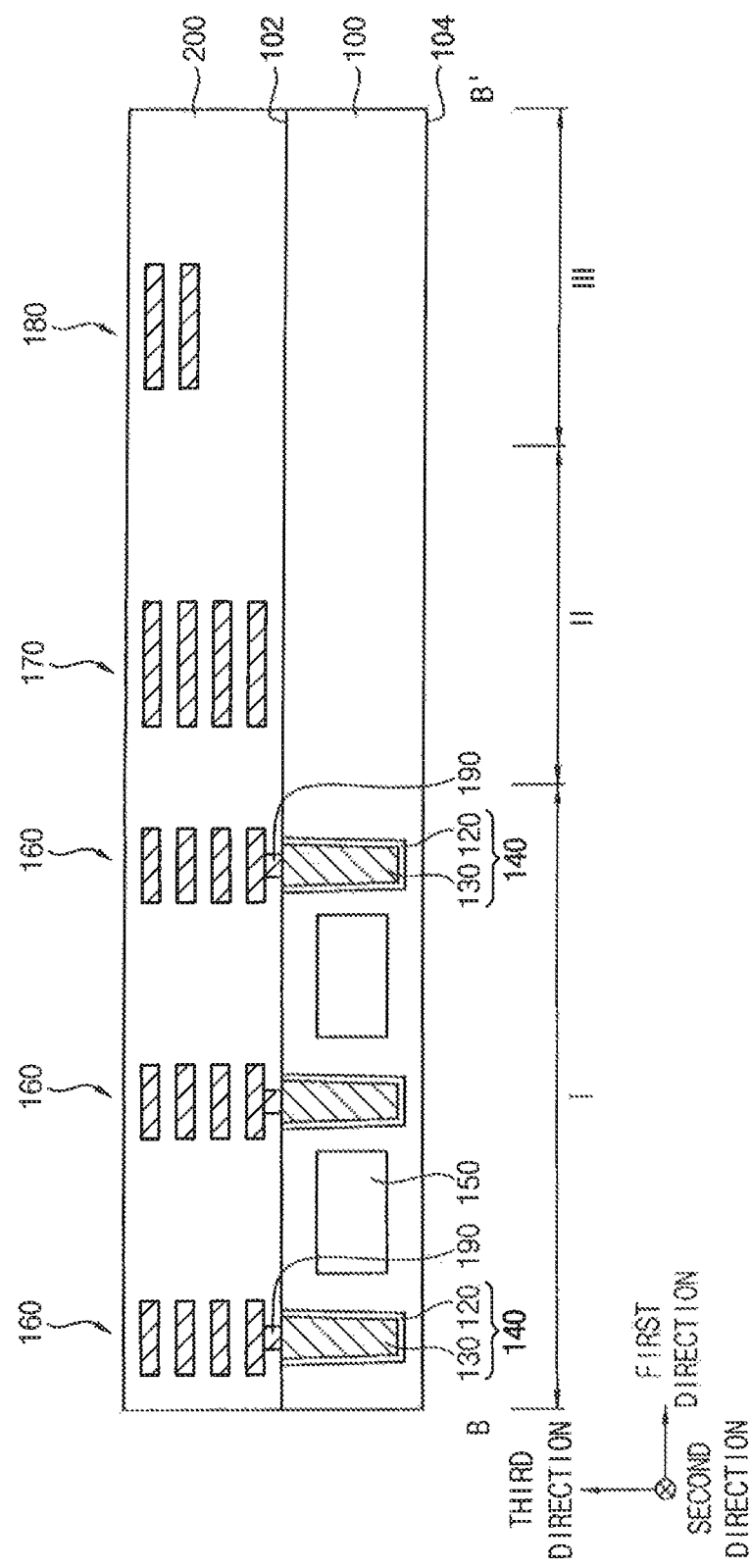

Referring to FIGS. 4 and 5, a first insulating interlayer 200 containing first to third wiring structures 160, 170 and 180 disposed therein may be formed on the first surface 102 of the first substrate 100.

The first to third wiring structures 160, 170 and 180 may be formed in the first to third regions I, II and III, respectively. In exemplary embodiments, the first wiring structure 160 may be formed to overlap the through via 140 and/or the pixel isolation pattern 110 in the third direction. However, the inventive concept is not limited thereto. For example, in exemplary embodiments, the first wiring structure 160 may be formed in various layouts.

FIGS. 4 and 5 illustrate that each of the first and second wiring structures 160 and 170 is formed at four levels in the third direction, and the third wiring structure 180 is formed at two levels in the third direction. For example, in the exemplary embodiment illustrated in FIGS. 4 and 5, each of the first and second wiring structures 160 and 170 includes four portions disposed adjacent to one another in the third direction, and the third wiring structure 180 includes two portions disposed adjacent to each other in the third direction. However, the inventive concept is not limited thereto. For example, in exemplary embodiments, each of the first to third wiring structures 160, 170 and 180 may be formed at another number of levels.

The first wiring structures 160 formed at a plurality of levels, respectively, the second wiring structures 170 formed at a plurality of levels, respectively, and the third wiring structures 180 formed at a plurality of levels, respectively, may be formed in the first insulating interlayer 200 such that they are electrically connected to one another through first vias disposed therebetween. In exemplary embodiments, the first to third wiring structures 160, 170 and 180 and the first vias may be formed by a dual damascene process or a single damascene process.

In exemplary embodiments, the through via 140 may be electrically connected to the first wiring structure 160 through a first contact plug 190 disposed in the first insulating interlayer 200. The FD region may also be electrically connected to the first wiring structure 160 through a second contact plug disposed in the first insulating interlayer 200.

Figure 6:
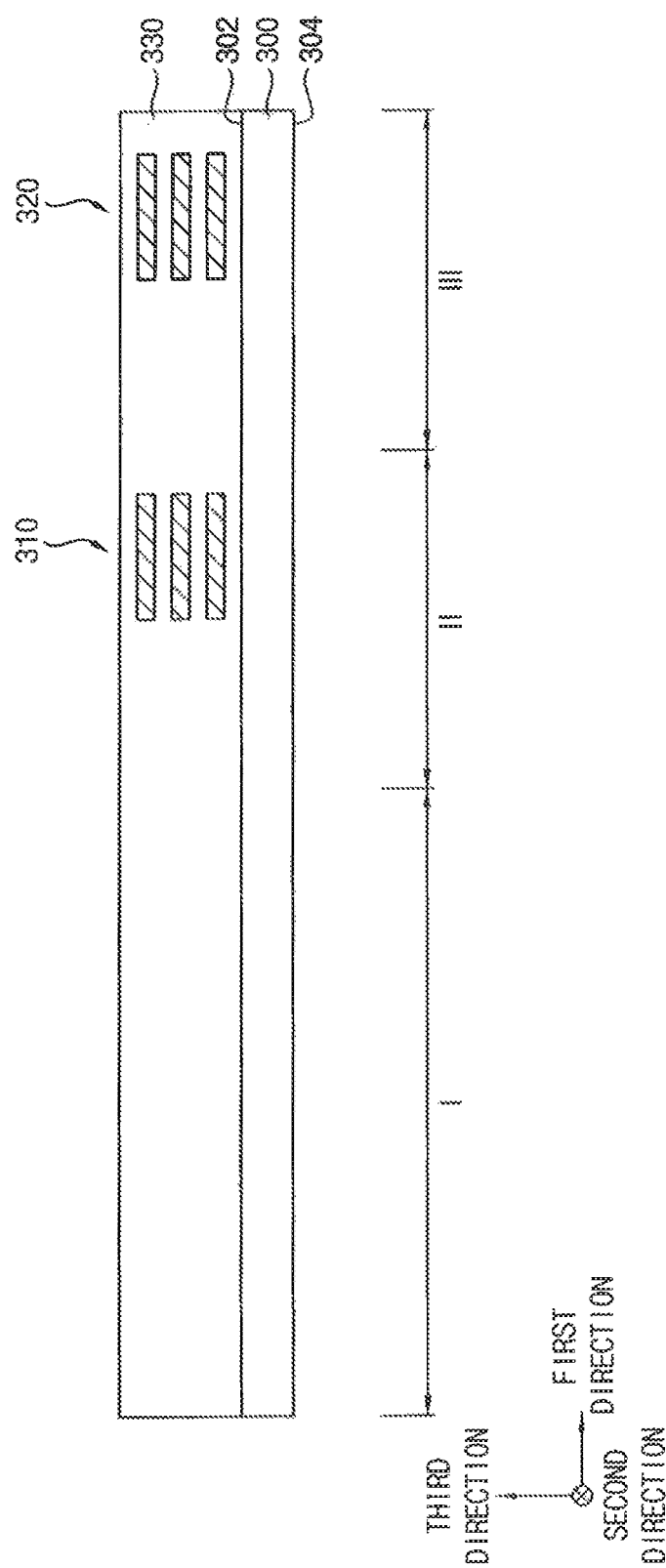

Referring to FIG. 6, a second insulating interlayer 330 containing fourth and fifth wiring structures 310 and 320 therein may be formed on a first surface 302 of a second substrate 300. The second substrate 300 includes the first surface 302 and a second surface 304 disposed opposite to the first surface 302.

The fourth and fifth wiring structures 310 and 320 may be formed in the second and third regions II and III, respectively. FIG. 6 illustrates that each of the fourth and fifth wiring structures 310 and 320 is formed at three levels in the third direction. For example, in the exemplary embodiment illustrated in FIG. 6, each of the fourth and fifth wiring structures 310 and 320 includes three portions disposed adjacent to one another in the third direction. However, the inventive concept is not limited thereto. For example, in exemplary embodiments, each of the fourth to fifth wiring structures 310 and 320 may be formed at another number of levels.

The fourth wiring structures 310 formed at a plurality of levels, respectively, and the fifth wiring structures 320 formed at a plurality of levels may be formed in the second insulating interlayer 330 such that they are electrically connected to one another through second vias disposed therebetween. In exemplary embodiments, the fourth and fifth wiring structures 310 and 320 and the second vias may be formed by a dual damascene process or a single damascene process.

Figure 7:
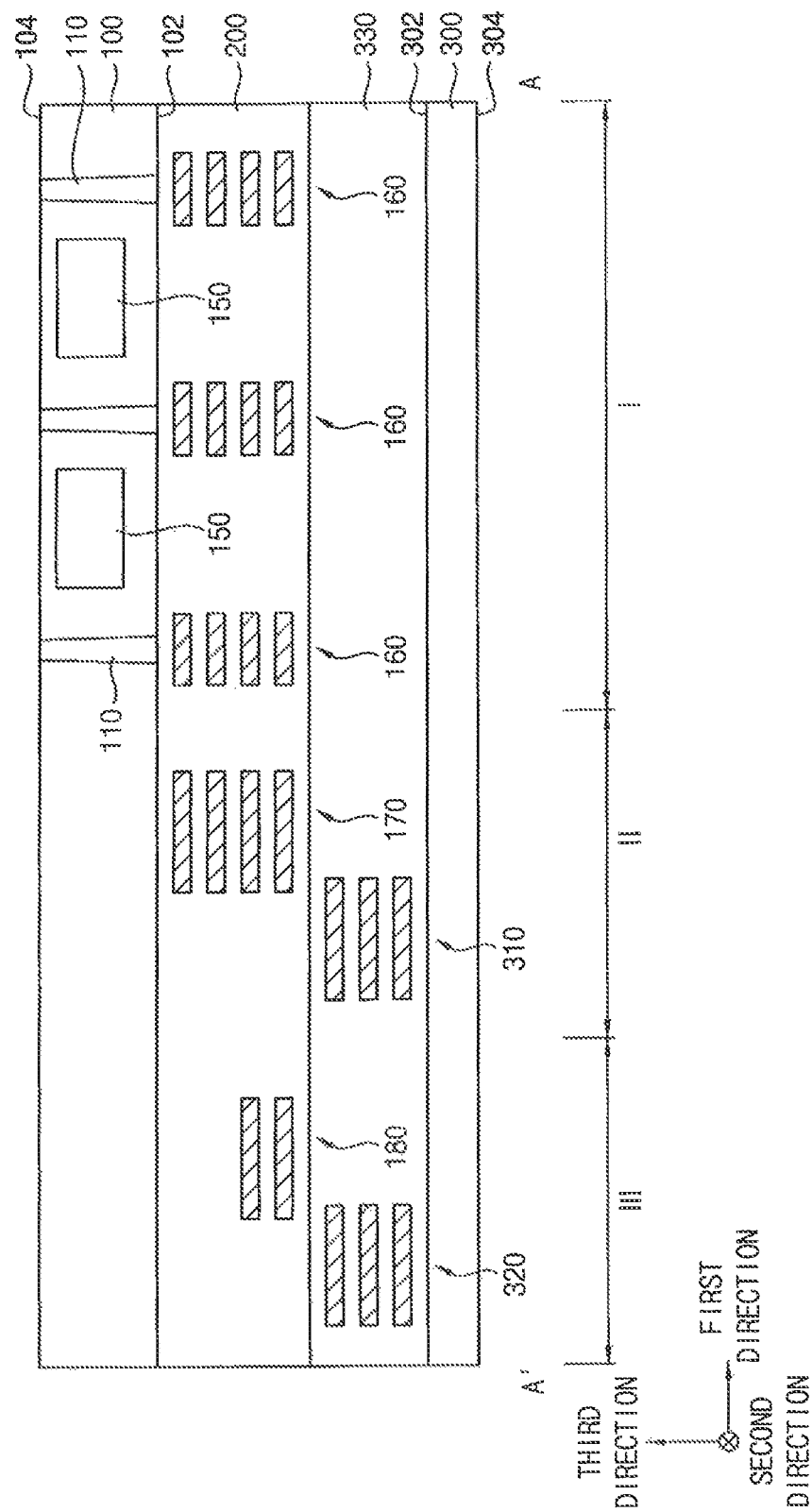
Figure 8:
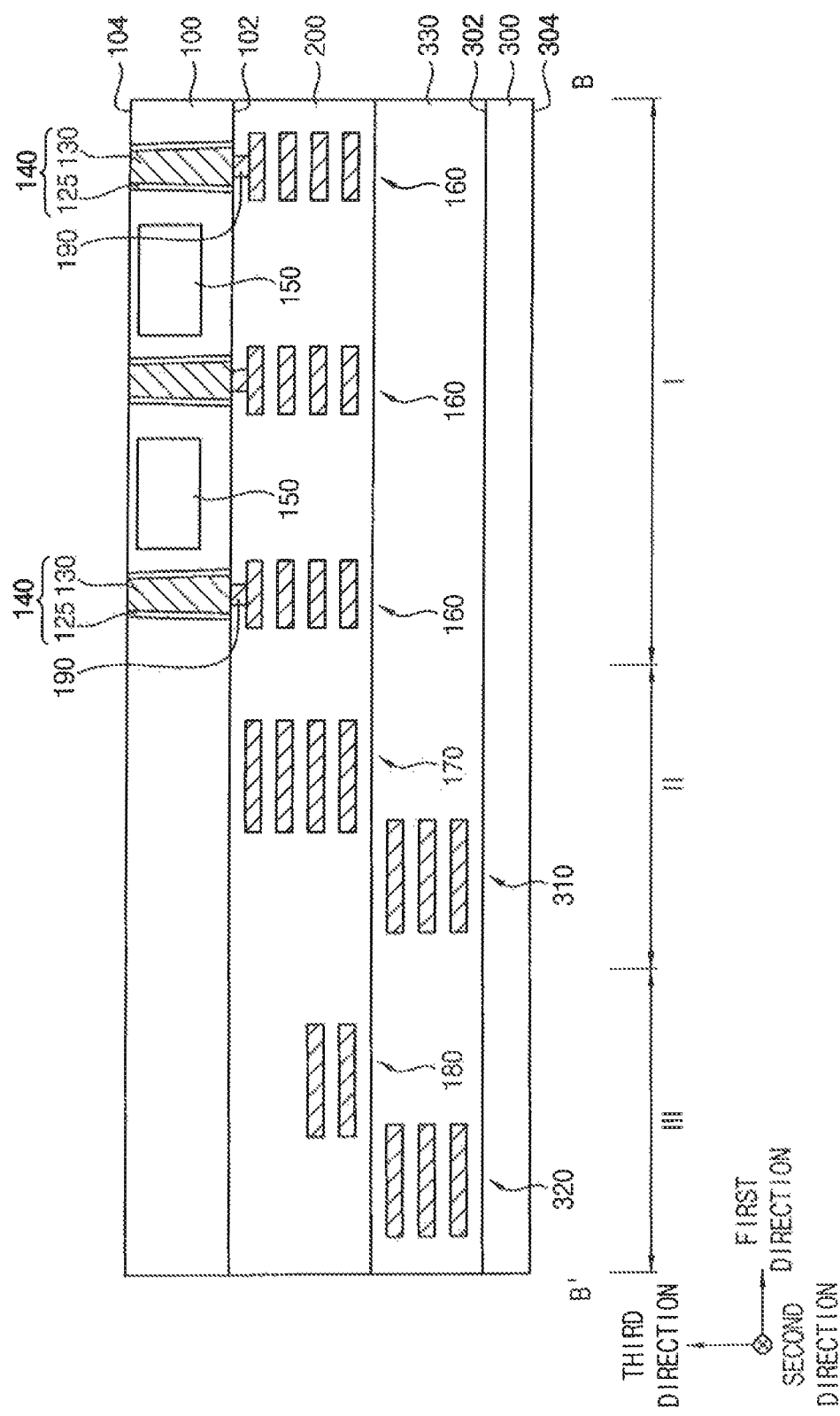

Referring to FIGS. 7 and 8, after bonding the first insulating interlayer 200 disposed on the first substrate 100 and the second insulating interlayer 330 disposed on the second substrate 300 to each other, a portion of the first substrate 100 adjacent to the second surface 104 of the first substrate 100 may be removed.

In exemplary embodiments, the first and second insulating interlayers 200 and 330 may be bonded to each other through a bonding layer. Alternatively, the first and second insulating interlayers 200 and 330 may be bonded to each other without a bonding layer. After bonding the first and second insulating interlayers 200 and 330 to each other, the orientation of the bonded structure may be reversed such that the second surface 104 of the first substrate 100 faces upwardly. Hereinafter, the second surface 104 of the first substrate 100 may be considered as facing upwardly.

In exemplary embodiments, the portion of the first substrate 100 adjacent to the second surface 104 may be removed by a polishing process such as, for example, a grinding process. Accordingly, the pixel isolation pattern 110 and the through via 140, which extend through the first substrate 100, may be exposed.

For example, a portion of the first insulation layer 120 covering an upper surface of the first conductive pattern 130 in the through via 140 (see FIG. 3) may be removed by the polishing process to form a first insulation pattern 125 (see FIG. 8). Accordingly, the through via 140 may include the first conductive pattern 130 and the first insulation pattern 125 covering a sidewall of the first conductive pattern 130.

Figure 9:
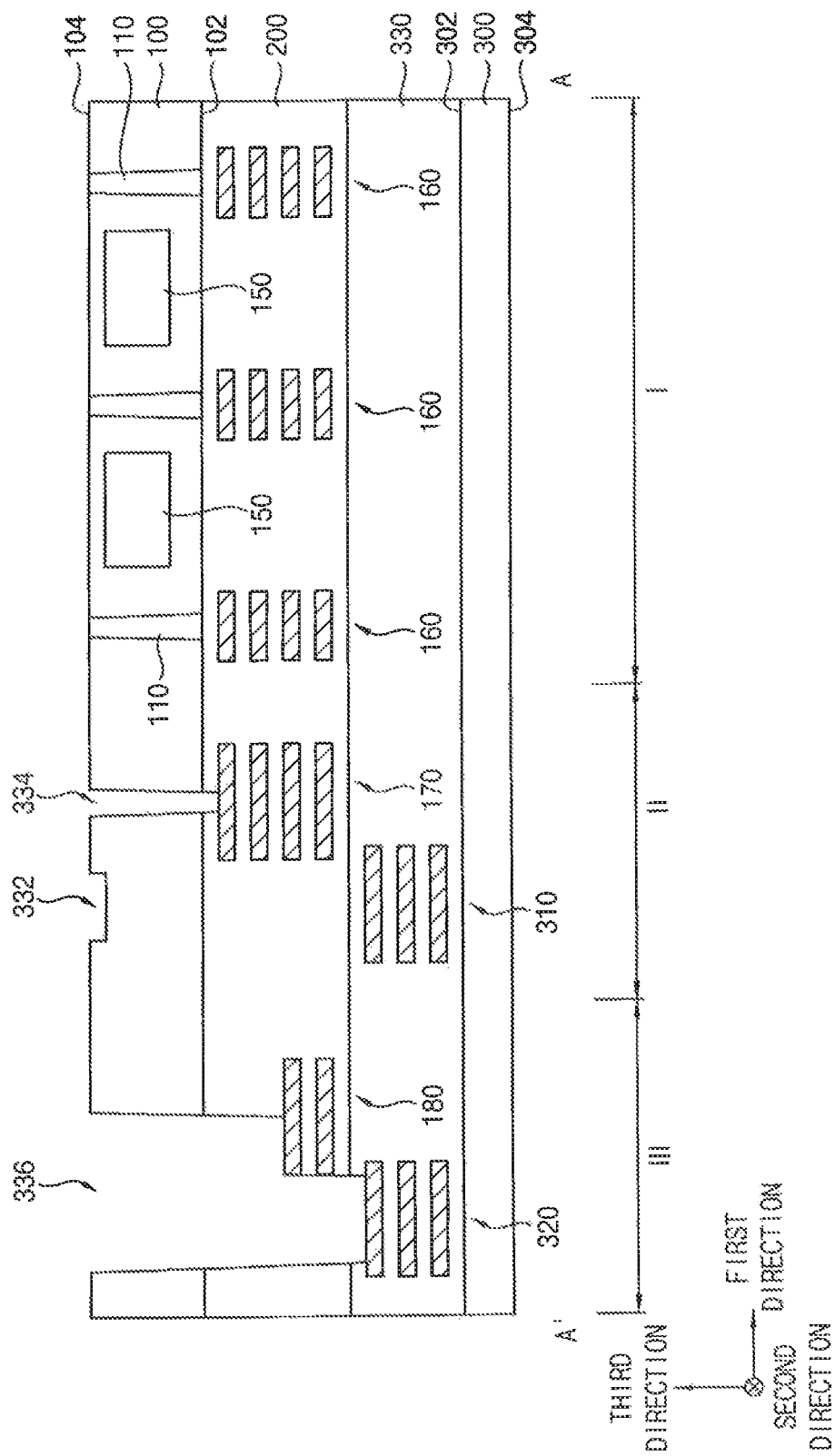

Referring to FIG. 9, a trench 332 extending through an upper portion of the first substrate 100 adjacent to the second surface 104, a first opening 334 adjacent to the trench 332 and extending through the first substrate 100 that exposes the second wiring structure 170, and a second opening 336 extending through the first substrate 100 and the first insulating interlayer 200 that exposes both the third and fifth wiring structures 180 and 320 may be formed.

The trench 332 and the first and second openings 334 and 336 may be formed on the second surface 104 of the first substrate 100 by forming an etching mask such as, for example, a photoresist pattern, and performing a dry etching process using the etching mask. The trench 332 and the first opening 334 may be formed in the second region II, and the second opening 336 may be formed in the third region III.

In exemplary embodiments, the second opening 336 may have a greater width than that of the first opening 334.

Figure 10:
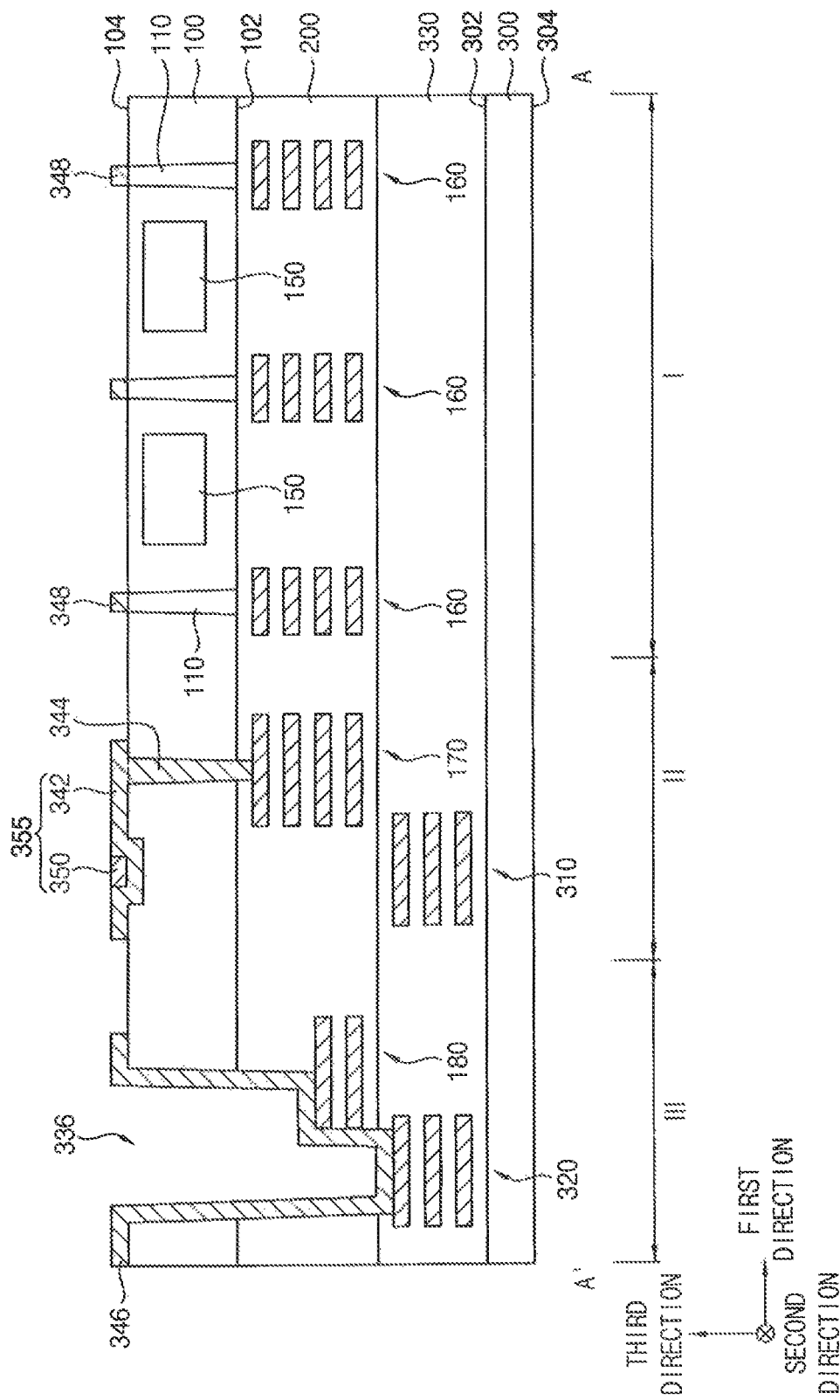

Referring to FIG. 10, a second conductive pattern 342 may be formed on the second surface 104 of the first substrate 100 to fill the trench 332, a third via 344 may be formed to fill the first opening 334 and contact a lower surface of the second conductive pattern 342, a fourth via 346 may be formed on an inner wall of the second opening 336 and the second surface 104 of the first substrate 100, and an interference prevention pattern 348 may be formed on the pixel isolation pattern 110. The fourth via 346 and the interference prevention pattern 348 may each include a conductive material. In an exemplary embodiment, the fourth via 346 and the interference prevention pattern 348 may include the same conductive material.

For example, a second conductive layer may be formed on the second surface 104 of the first substrate 100 at a location at which the trench 332 and the first and second openings 334 and 336 are formed, and the second conductive layer may be patterned to form the interference prevention pattern 348, the second conductive pattern 342, the third via 344, and the fourth via 346 in the first to third regions I, II and III, respectively.

In exemplary embodiments, the interference prevention pattern 348 may be formed to overlap the pixel isolation pattern 110 in the third direction on an upper surface thereof. Accordingly, the interference prevention pattern 348 may also have a lattice shape in which some portions are cut. The interference prevention pattern 348 may serve as a barrier to prevent a light incident on one pixel from entering adjacent pixels, so that the interference between the adjacent pixels may be prevented or reduced.

The second conductive pattern 342 may fill the trench 332, and may be formed on a portion of the second surface 104 of the first substrate 100 adjacent to the trench 332. The third via 344 may fill the first opening 334, and may contact the underlying second wiring structure 170 and the overlying second conductive pattern 342.

The second opening 336 may have a width greater than that of the first opening 334, and may have a depth greater than that of the trench 332. Accordingly, in an exemplary embodiment, the second conductive layer may entirely fill the trench 332 and the first opening 334, and does not entirely fill the second opening 336. As a result, the fourth via 346 disposed in the second opening 336 may be conformally formed on a sidewall of the second opening 336 and upper surfaces of the third and fifth wiring structures 180 and 320 exposed by the second opening 336.

In exemplary embodiments, the second conductive layer may include a metal such as, for example, tungsten, titanium, tantalum, etc.

A portion of the second conductive pattern 342 overlapping the trench 332 in the third direction may have a concave upper surface depending on the depth of the trench 332, and a third conductive pattern 350 may be further formed on the concave upper surface of the second conductive pattern 342. Accordingly, the second and third conductive patterns 342 and 350, which are sequentially stacked on each other, may form a pad 355.

The first region I may correspond to a pixel region, the second region II may correspond to a pad region and the third region III may correspond to an input/output region. Thus, as shown in FIG. 10, in an exemplary embodiment, the interference prevention pattern 348 may be formed in the pixel region (region I), the pad 355 may be formed in the pad region (region II) and the fourth via 346 may be formed in the input/output region (region III).

In an exemplary embodiment, the pad 355 and the interference prevention pattern 348 may be formed of substantially the same conductive material as each other.

In an exemplary embodiment, the third conductive pattern 350 may be formed by forming a third conductive layer on the second conductive pattern 342, and etching the third conductive layer. The third conductive pattern 350 may include a metal such as, for example, aluminum.

Figure 11:
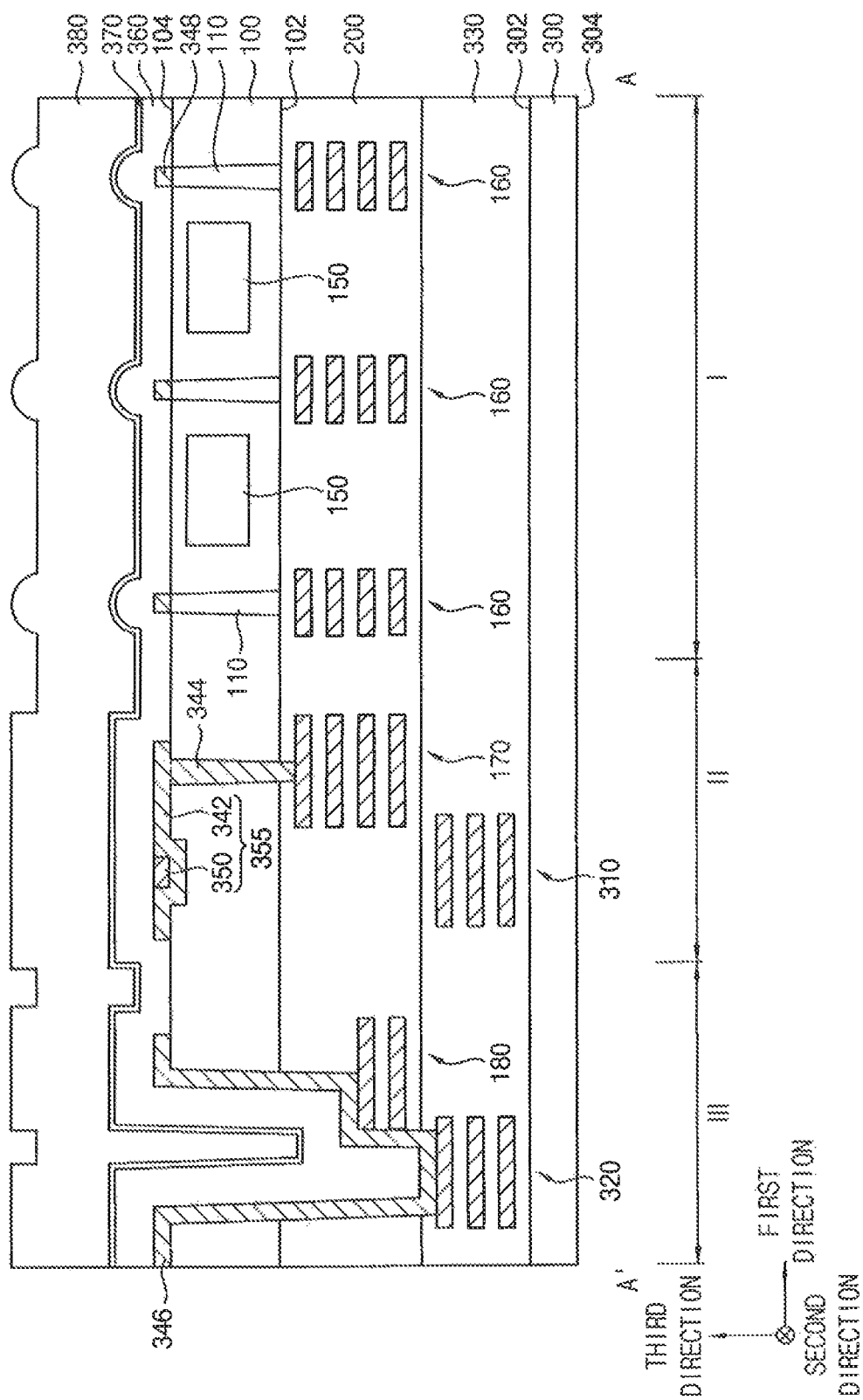
Figure 12:
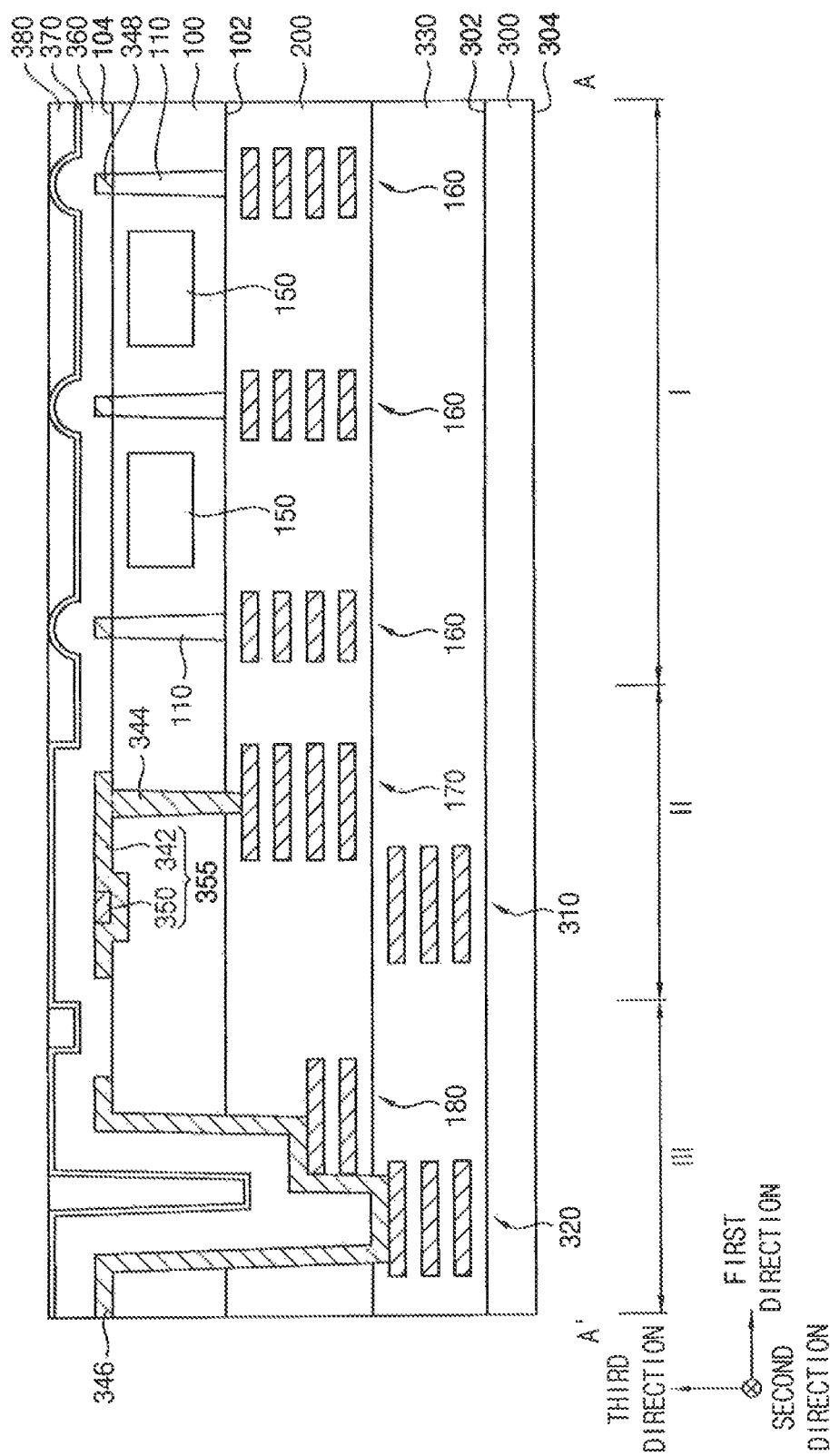

Referring to FIG. 11, after forming a third insulating interlayer 360 on the interference prevention pattern 348, the pad 355, the fourth via 346 and the second surface 104 of the first substrate 100, a polishing stop layer 370 and a fourth insulating interlayer 380 may be sequentially formed on the third insulating interlayer 360. The third insulating interlayer 360 may cover the fourth via 346 and partially fill the trench in which the fourth via 346 is disposed. Further, the third insulating interlayer 360 may have a non-flat upper surface. Further, the third insulating interlayer 360 may include a first portion disposed in the trench in which the fourth via 346 is disposed, and a second portion disposed outside the trench. As shown in FIGS. 11 and 12, the first portion of the third insulating interlayer 360 disposed in the trench in which the fourth via 346 is disposed may include a concave upper surface, and the second portion of the third insulating interlayer 360 disposed outside the trench may include a substantially flat upper surface.

In exemplary embodiments, the third insulating interlayer 360 does not entirely fill the second opening 336, and thus, may have a concave upper surface in the second opening 336. Also, the third insulating interlayer 360 may have a convex upper surface on the interference prevention pattern 348 and the pad 355 on the second surface 104 of the first substrate 100. Accordingly, the third insulating interlayer 360 may have a curved upper surface rather than a flat surface.

Accordingly, the polishing stop layer 370 and the fourth insulating interlayer 380 stacked on an upper surface of the third insulating interlayer 360 may also have curved upper surfaces rather than flat surfaces. The polishing stop layer 370 may be formed to have a thickness smaller than those of the third and fourth insulating interlayers 360 and 380, and thus may be conformally formed on the third insulating interlayer 360 such that it does not entirely fill the second opening 336. However, the fourth insulating interlayer 380 may be formed to have a sufficient thickness to entirely fill a remaining portion of the second opening 336. As shown in FIG. 11, the fourth insulating interlayer 380 may fill a remaining portion of the trench in which the fourth via 346 is disposed. For example, as described above, the third insulating interlayer 360 may only partially fill this trench. The fourth insulating interlayer 380 may fill the remaining portion of this trench that is not filled by the third insulating interlayer 360.

The third and fourth insulating interlayers 360 and 380 may include an oxide such as, for example, silicon oxide. In exemplary embodiments, the third and fourth insulating interlayers 360 and 380 may include the same material. Alternatively, the third and fourth insulating interlayers 360 and 380 may include different materials from each other. In this case, the materials may have a low etching selectivity relative to each other.

In exemplary embodiments, the polishing stop layer 370 may have a material having a high polishing selectivity with respect to the fourth insulating interlayer 380 (e.g., about equal to or less than about 1:10). That is, the polishing selectivity between the fourth insulating interlayer 380 and the polishing stop layer 370 may be about equal to or greater than about 10:1. For example, the polishing stop layer 370 may include a nitride such as, for example, silicon nitride (SiN), silicon oxynitride (SiON), silicon carbonitride (SiCN), silicon oxycarbonitride (SiOCN), etc., or a carbide such as, for example, silicon carbide (SiC), silicon oxycarbide (SiOC), etc.

Referring to FIG. 12, a polishing process may be performed on the fourth insulating interlayer 380 until the polishing stop layer 370 is exposed. For example, the fourth insulating interlayer 380 may be planarized until the polishing stop layer 370 is exposed.

In exemplary embodiments, the polishing process may include a chemical mechanical polishing (CMP) process. The CMP process may be formed using a slurry such as, for example, cerium oxide ($CeO_x$), silicon oxide ($SiO_x$), aluminum oxide ($Al_xO_y$), zirconium oxide ($ZrO_x$), etc. In the CMP process, the fourth insulating interlayer 380 and the polishing stop layer 370 may have a high polishing selectivity with respect to each other, and thus, the CMP process may be efficiently performed until the polishing stop layer 370 is exposed.

The polishing stop layer 370 may have a curved upper surface rather than a flat upper surface. As a result, after the polishing process is performed, the fourth insulating interlayer 380 may not be entirely removed, and a portion thereof may remain on the polishing stop layer 370.

Figure 13:
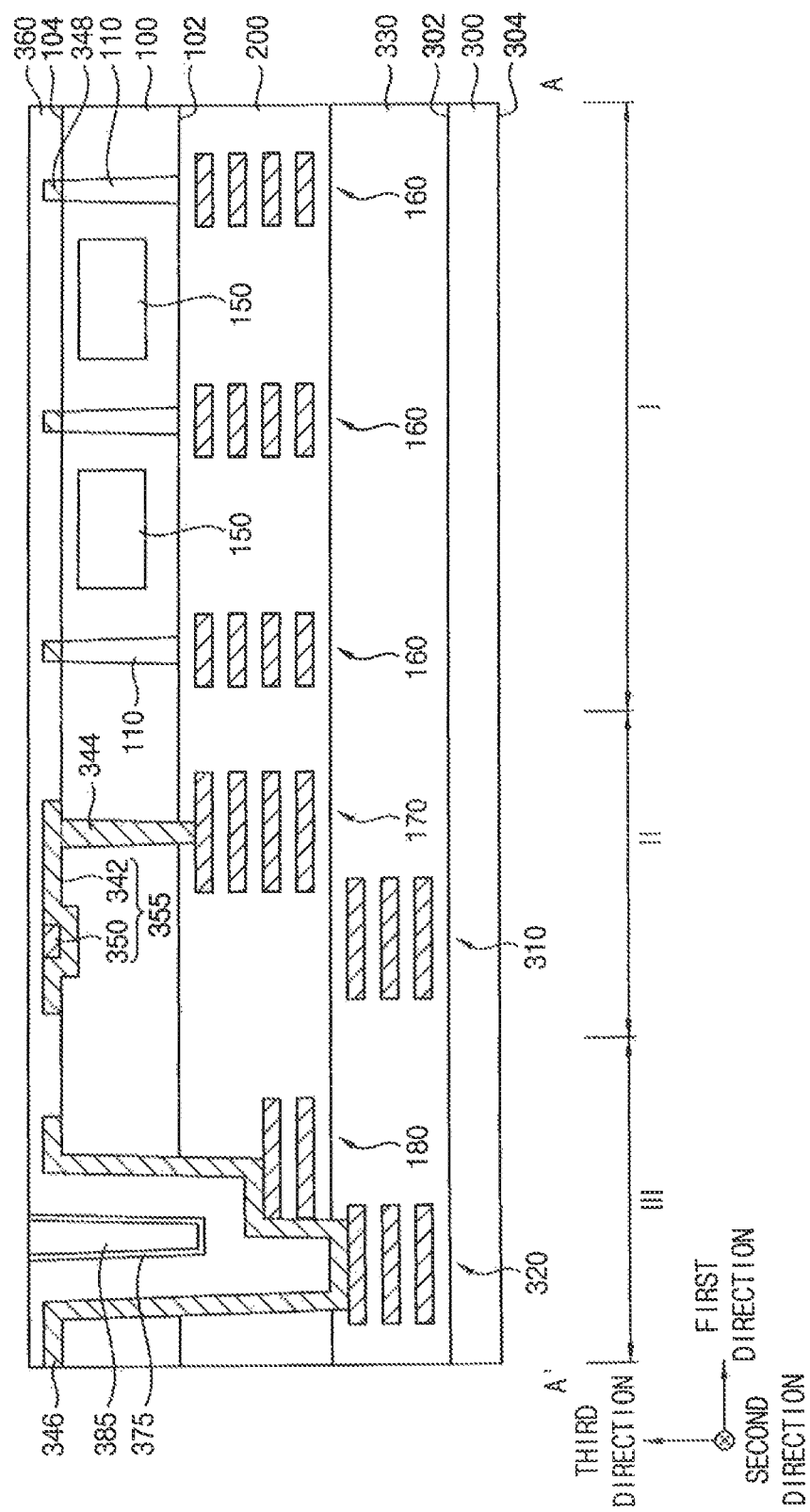

Referring to FIG. 13, until other remaining portions of the polishing stop layer 370 except for a portion thereof in the second opening 336 are entirely removed, the polishing stop layer 370, the remaining portion of the fourth insulating interlayer 380, and the third insulating interlayer 360 may be removed.

In exemplary embodiments, the polishing stop layer 370 and the third and fourth insulating interlayers 360 and 380 may be removed by a dry etching process. The dry etching process may be performed using an etching gas having a low etching selectivity, for example, an etching selectivity of about 0.5:1.5 to about 1.5:0.5 between the polishing stop layer 370 and the third and fourth insulating interlayers 360 and 380. Accordingly, the polishing stop layer 370 and the third and fourth insulating interlayers 360 and 380 may be etched at a similar rate to each other during the etching process, so that the remaining upper surface of the third insulating interlayer 360 after the etching process is flat. For example, by utilizing a dry etching process instead of a planarization process, for example, a CMP process, the third insulating interlayer 360 may have a flat upper surface. The etching gas may include, for example, fluorocarbon (CH$_4$), fluoroform (CHF$_3$), oxygen (O$_2$), etc.

After the etching process, in addition to the fourth via 346 and the third insulating interlayer 360, the polishing stop layer 370 and the fourth insulating interlayer 380 may remain to form a polishing stop pattern 375 and a second insulation pattern 385, respectively, in the second opening 336.

For example, as shown in FIGS. 12 and 13, the polishing stop layer 370 and the third and fourth insulating interlayers 360 and 380 may be etched using a dry etching process until remaining portions of the polishing stop layer 370 except for a portion of the polishing stop layer (e.g., polishing stop pattern 375) in the trench in which the fourth via 346 is disposed are removed. Further, as shown in FIG. 13, the fourth insulating interlayer 360 covering the fourth via 346 and the interference prevention pattern 348 has a non-flat upper surface before the dry etching process is performed, and the fourth insulating interlayer 360 covering the fourth via 346 and the interference prevention pattern 348 has a substantially flat upper surface after the dry etching process has been performed.

As described above, the third insulating interlayer 360 may include a first portion disposed in the trench in which the fourth via 346 is disposed, and a second portion disposed outside the trench. A portion of the second insulation pattern 385 may fill a remaining portion of the trench, and may include an upper surface that is substantially coplanar with the upper surface of the second portion of the third insulating interlayer 360 that is disposed outside the trench, as shown in FIG. 13. For example, the upper surface of the second insulation pattern 385 that fills the remaining portion of the trench may be substantially aligned with the upper surface of the second portion of the third insulating interlayer 360 that is disposed outside the trench.

As shown in FIG. 13, in an exemplary embodiment, an upper surface of the second insulation pattern 385, an uppermost surface of the polishing stop pattern 375 and an upper surface of the third insulating interlayer 360 may be substantially coplanar with one another.

Figure 15:
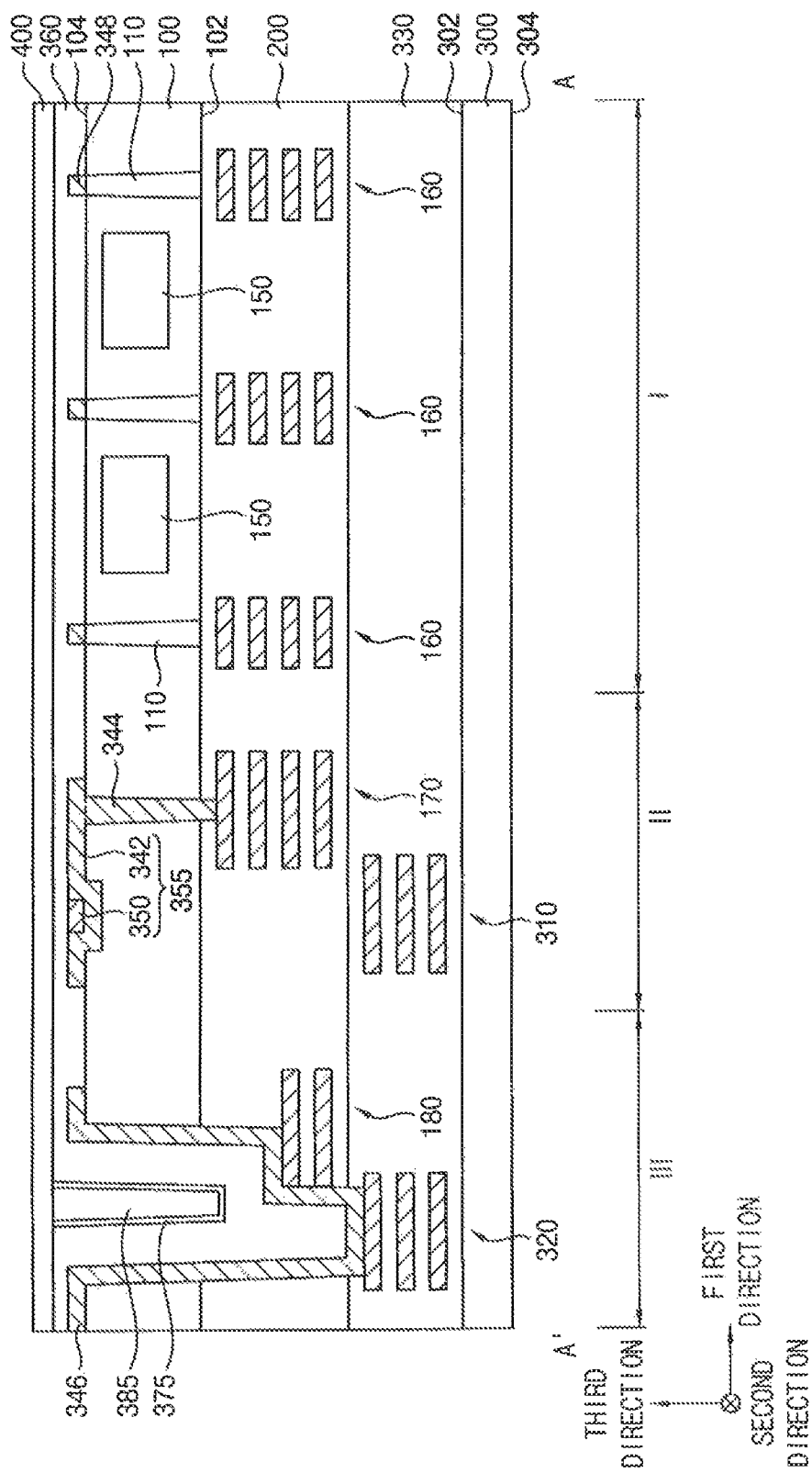
Figure 16:
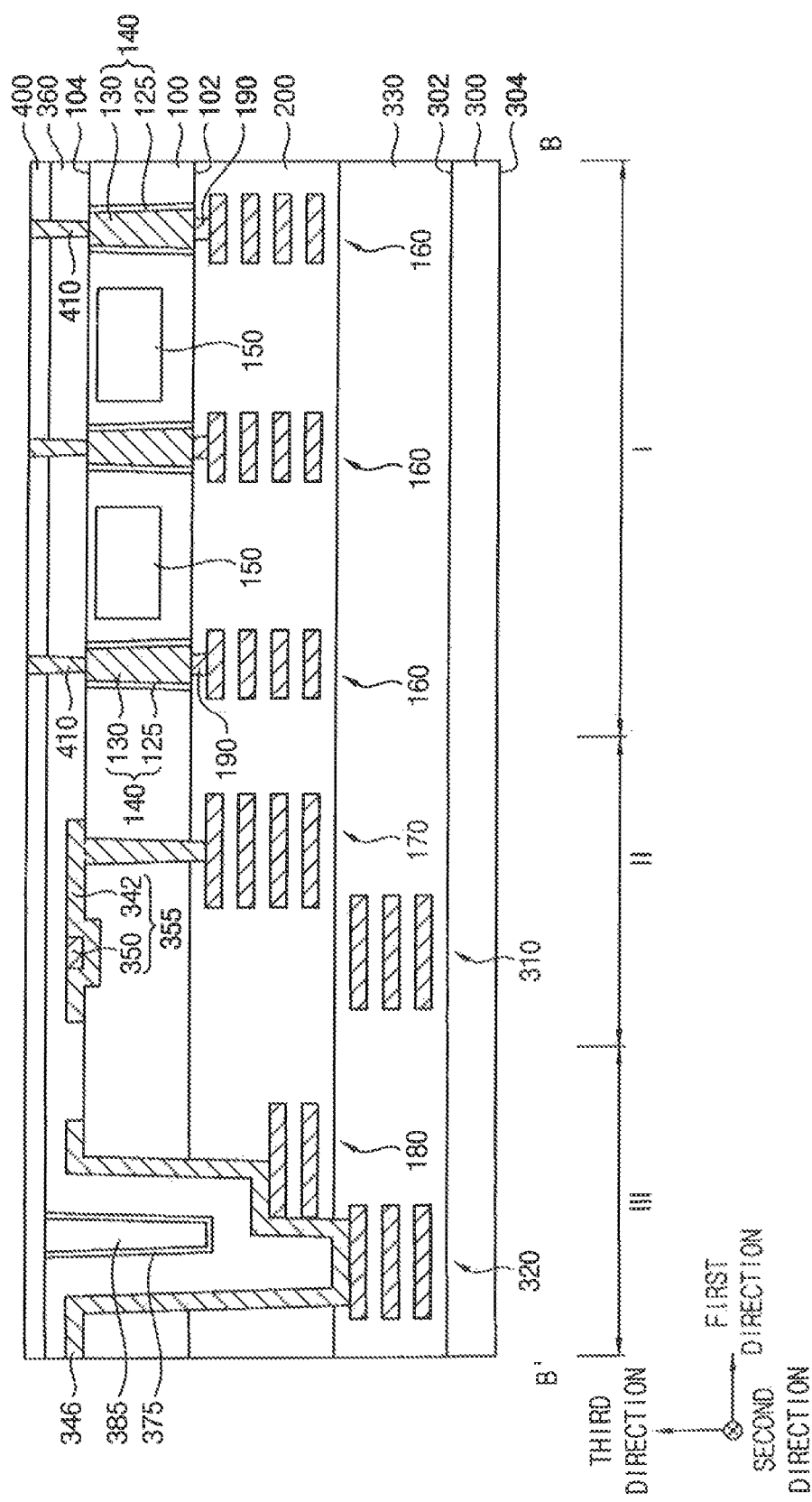

Referring to FIGS. 14 to 16, after forming a fifth insulating interlayer 400 on the third insulating interlayer 360, the polishing stop pattern 375 and the second insulation pattern 385, a third contact plug 410 may be formed through the third and fifth insulating interlayers 360 and 400 to contact the through via 140.

The through via 140 may be formed at the cutting portion of the pixel isolation pattern 110 having a lattice shape in which some portions are cut. Thus, the third contact plug 410 may also overlap the cutting portion of the pixel isolation pattern 110 in the third direction, so that it does not overlap the pixel isolation pattern 110 in the third direction.

The fifth insulating interlayer 400 may include an oxide such as, for example, silicon oxide. The third contact plug 410 may include, for example, a metal, a metal nitride, doped polysilicon, etc.

Figure 17:
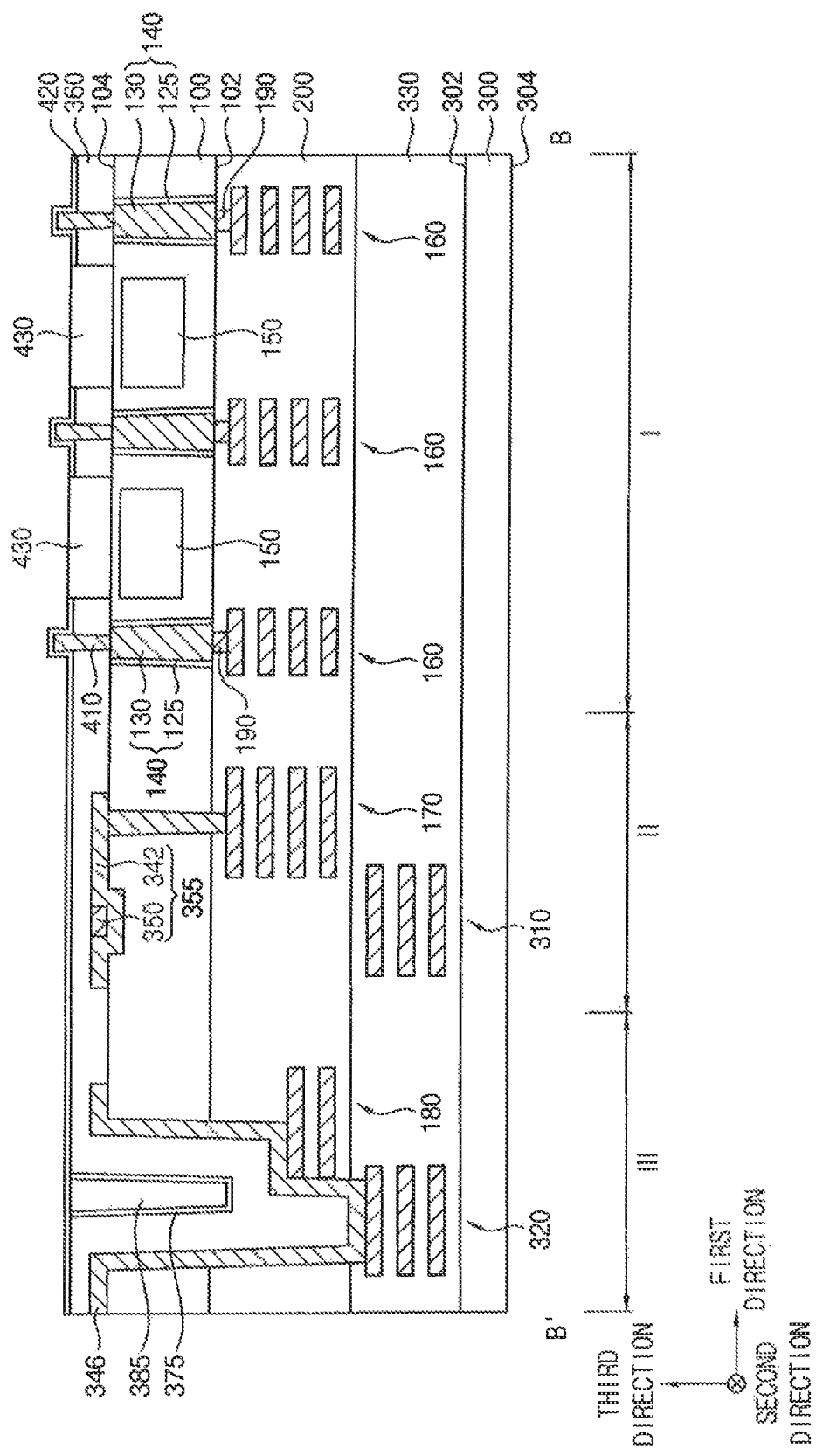

Referring to FIG. 17, after removing the fifth insulating interlayer 400 to expose upper surfaces of the third insulating interlayer 360, the polishing stop pattern 375 and the second insulation pattern 385, and an upper portion of the third contact plug 410, a third insulation layer 420 may be formed thereon.

The third insulation layer 420 may include an oxide such as, for example, silicon oxide, or a nitride such as, for example, silicon nitride.

A color filter 430 may be formed through the third insulation layer 420 and the third insulating interlayer 360.

In exemplary embodiments, the color filter 430 may be formed within the unit pixel region defined by the pixel isolation pattern 110 and the through via 140, and does not overlap the pixel isolation pattern 110 and the through via 140 in the third direction.

In exemplary embodiments, the color filter 430 may be a red filter or a blue filter.

Figure 18:
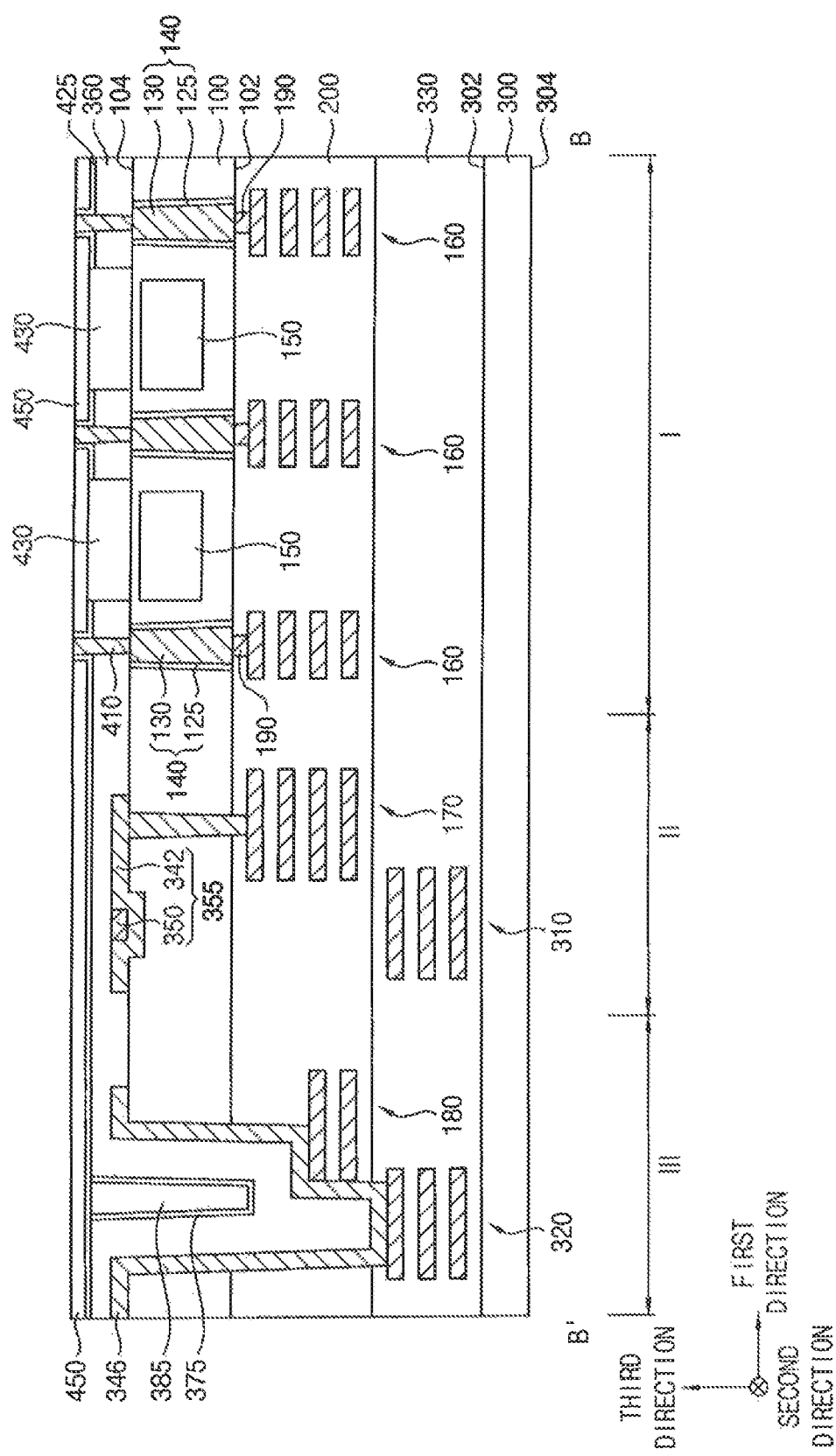

Referring to FIG. 18, after forming a fourth insulation layer 450 on the third insulation layer 420 and the color filter 430, the fourth insulation layer 450 may be planarized until an upper surface of the third contact plug 410 is exposed.

In exemplary embodiments, the planarization process may include a CMP process, and in the CMP process, a portion of the third insulation layer 420 on the upper surface of the third contact plug 410 may be also removed so that a third insulation pattern 425 remains. Accordingly, the third insulation pattern 425 may cover an upper sidewall of the third contact plug 410.

The fourth insulation layer 450 may include an oxide such as, for example, silicon oxide.

Figure 19:
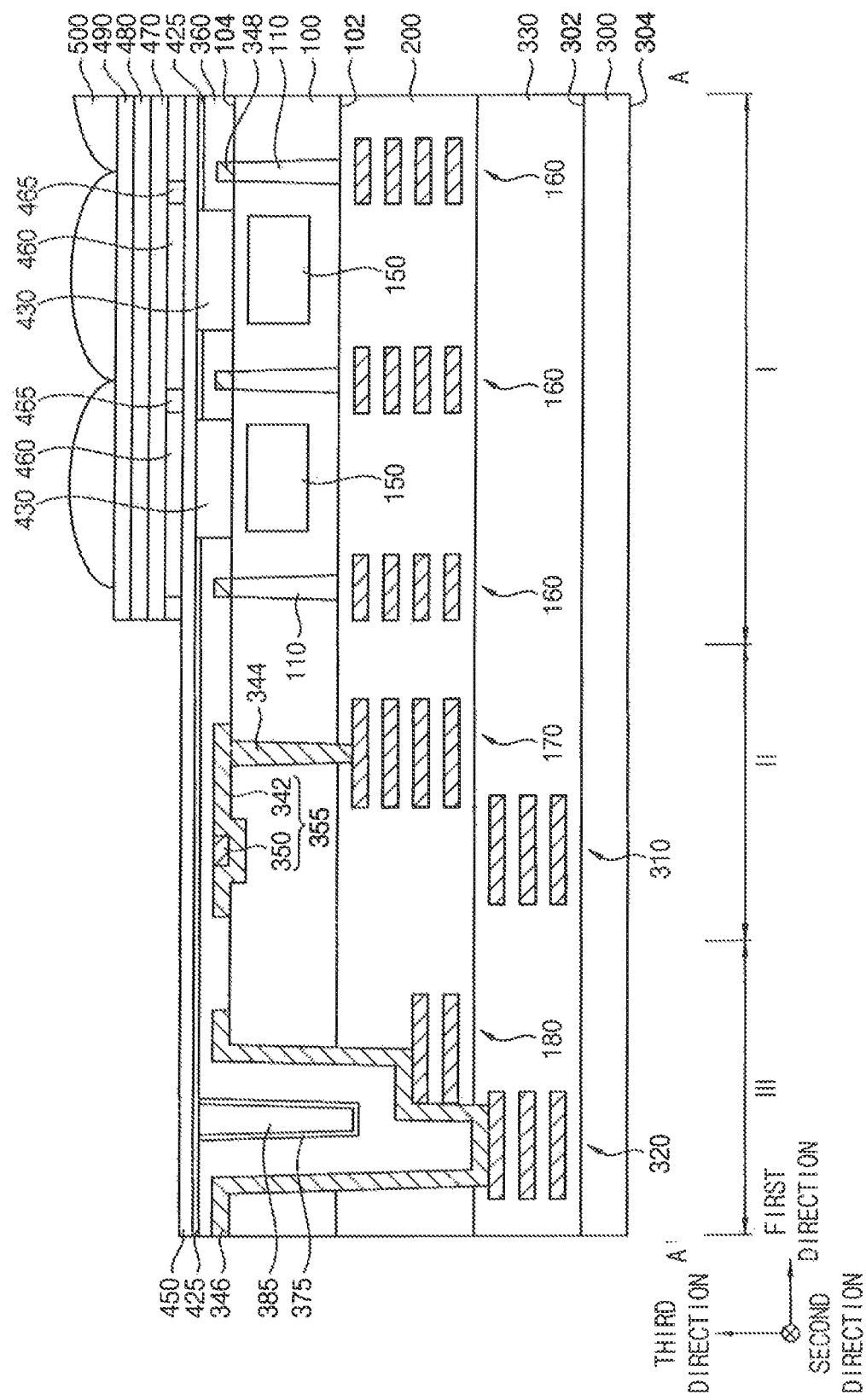
Figure 20:
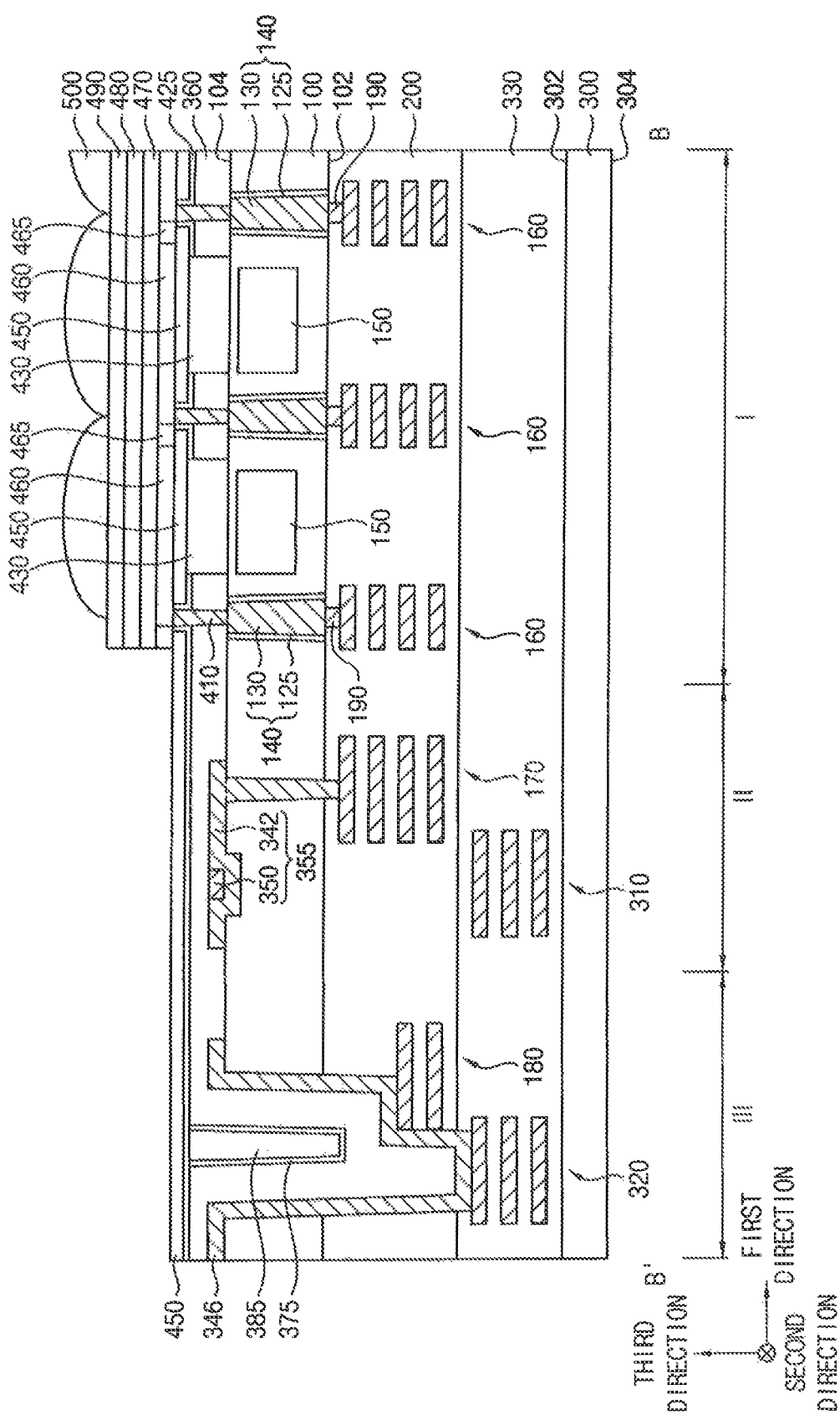

Referring to FIGS. 19 and 20, a first transparent electrode 460, an organic layer 470, a second transparent electrode 480, a protective layer 490 and a microlens 500 may be sequentially stacked on the fourth insulation layer 450, the third insulation pattern 425 and the third contact plug 410 in the first region I.

In exemplary embodiments, the first transparent electrode 460 may be correspondingly formed in each of the unit pixel regions, and may contact the upper surface of the third contact plug 410. A sidewall of the first transparent electrode 460 may be covered by the fifth insulation layer 465.

In exemplary embodiments, the organic layer 470, the second transparent electrode 480 and the protective layer 490 may be formed over the entire first region I, and the microlens 500 may be correspondingly formed in each of the unit pixel regions. The first transparent electrode 460, the organic layer 470 and the second transparent electrode 480 sequentially stacked in the third direction may form an organic photodiode.

The first and second transparent electrodes 460 and 480 may include, for example, ITO, IZO, ZnO, SnO$_2$, antimony-doped tin oxide (ATO), antimony-doped zinc oxide (AZO), gallium-doped zinc oxide (GZO), TiO$_2$, fluorine-doped tin oxide (FTO), etc. The organic layer 470 may include an organic material in which an electron donor and an electron acceptor are mixed with each other. For example, the organic layer 470 may include a plurality of layers in which a p-type semiconductor material and an n-type semiconductor material may form a pn-junction or a bulk hetero-junction. The protective layer 490 may include an oxide such as, for example, silicon oxide.

Upper wiring structures may be formed such that they are electrically connected to the pad 355 and the fourth via 346 in the second and third regions II and III.

As described above, when the third insulating interlayer 360 is initially formed to cover the interference prevention pattern 348, the pad 355 and the fourth via 346, the third insulating interlayer 360 may not have a flat upper surface, but rather, may have a curved upper surface due to the interference prevention pattern 348, the pad 355 and the fourth via 346. However, in exemplary embodiments, after sequentially forming the polishing stop layer 370 and the fourth insulating interlayer 380 on the third insulating interlayer 360, the fourth insulating interlayer 380 may be planarized by the CMP process until the polishing stop layer 370 is exposed, and the dry etching process may be performed using the etching gas having the low etching selectivity between the polishing stop layer 370 and the third and fourth insulating interlayers 360 and 380 to remove the third and fourth insulating interlayers 360 and 380 until the polishing stop layer 370 is removed. Accordingly, the remaining third insulating interlayer 360 may have a flat upper surface.

If the third insulating interlayer 360 is formed on the interference prevention pattern 348, the pad 355 and the fourth via 346 to have a large enough thickness such that it entirely fills the remaining portion of the second opening 336 having a relatively great width, and the upper surface of the third insulating interlayer 360 is planarized by a CMP process, due to the large amount of the third insulating interlayer 360 to be removed by the CMP process, the finally remaining third insulating interlayer 360 may have an uneven upper surface as a whole. For example, the upper surface of the third insulating interlayer 360 may have a height distribution depending on the position thereof. For example, the upper surface of the third insulating interlayer 360 may be uneven depending on the position thereof.

If after forming the third insulating interlayer 360 to partially fill the second opening 336 having a relatively great width, the CMP process and subsequent processes are performed without filling a remaining portion of the second opening 336, voids may be formed in the second opening 336. As a result, a residue may remain in the voids, which may cause the generation of defects during the CMP process and the subsequent processes.

However, as described above, in exemplary embodiments, after initially forming the third insulating interlayer 360 to cover the interference prevention pattern 348, the pad 355 and the fourth via 346, and partially filling the second opening 336 (instead of entirely filling the second opening 336), the polishing stop layer 370 may be formed on the third insulating interlayer 360, and the fourth insulating interlayer 380 may be formed to fill the remaining portion of the second opening 336. Accordingly, the CMP process on the fourth insulating interlayer 380 may be performed only until the polishing stop layer 370 having a high polishing selectivity is exposed, and thus, may be efficiently performed at a high rate. Additionally, the dry etching process having the low etching selectivity between the polishing stop layer 370 and the third and fourth insulating interlayers 360 and 380 may be performed thereon, so that the upper surface of the finally remaining third insulating interlayer 360 may have a uniform height with no height distribution depending on the position thereof. That is, the third insulating interlayer 360 may have a flat upper surface instead of being uneven.

Accordingly, the color filter 430 in the third insulating interlayer 360 in the first region I in which pixels may be formed and the organic photodiode or the microlens 500 on the third insulating interlayer 360 may be formed at a uniform height, and the image sensor including the color filter 430, the organic photodiode and/or the microlens 500 may have improved characteristics.

Up to now, the fourth via 346 is formed on the inner wall of the second opening 336 extending through the first substrate 100 to expose the third and fifth wiring structures 180 and 320, and the third insulating interlayer 360 covering the fourth via 346 and partially filling the second opening 336 has the curved upper surface rather than a flat upper surface. However, the inventive concept is not limited thereto. For example, according to exemplary embodiments of the inventive concept, a conductive structure may be formed on an inner wall of a trench that does not extend entirely through the first substrate 100, but rather, that partially extends through the first substrate 100 and has a great width, and an insulating interlayer covering the conductive structure and partially filling the trench may have a curved upper surface rather than a flat upper surface.

The image sensor manufactured by the above processes may include the pixel isolation pattern 110 extending through the first region I of the first substrate 100 including the first to third regions I, II and III, the first and second insulating interlayers 200 and 330 containing the first to fifth wiring structures 160, 170, 180, 310 and 320 therein under the first substrate 100, the fourth via 346 including a conductive material on the inner wall of the second opening 336 extending through the third region III of the first substrate 100 to expose the third and fifth wiring structures 180 and 320, the interference prevention pattern 348 including a conductive material on the upper surface of the pixel isolation pattern 110, the pad 355 filling the trench 332 on the first substrate 100 and including a conductive material, the third insulating interlayer 360 on the first substrate 100 and covering the fourth via 346, the pad 355 and the interference prevention pattern 348, the polishing stop pattern 375 on the portion of the third insulating interlayer 360 in the second opening 336, and the second insulation pattern 385 on the polishing stop pattern 375 and filling the remaining portion of the second opening 336.

In exemplary embodiments, the third insulating interlayer 360 may have the concave upper surface in the second opening 336. In exemplary embodiments, the polishing stop pattern 375 may be formed on a first portion of the third insulating interlayer 360 in the second opening 336, and the second insulation pattern 385 may be formed on the polishing stop pattern 375 to fill the remaining portion of the second opening 336.

In exemplary embodiments, an upper surface of the second insulation pattern 385 and an uppermost surface of the polishing stop pattern 375 may be formed at substantially the same height as an upper surface of a second portion of the third insulating interlayer 360 outside the second opening 336, and the upper surface of the second portion of the third insulating interlayer 360 may be substantially flat.

Figure 21:
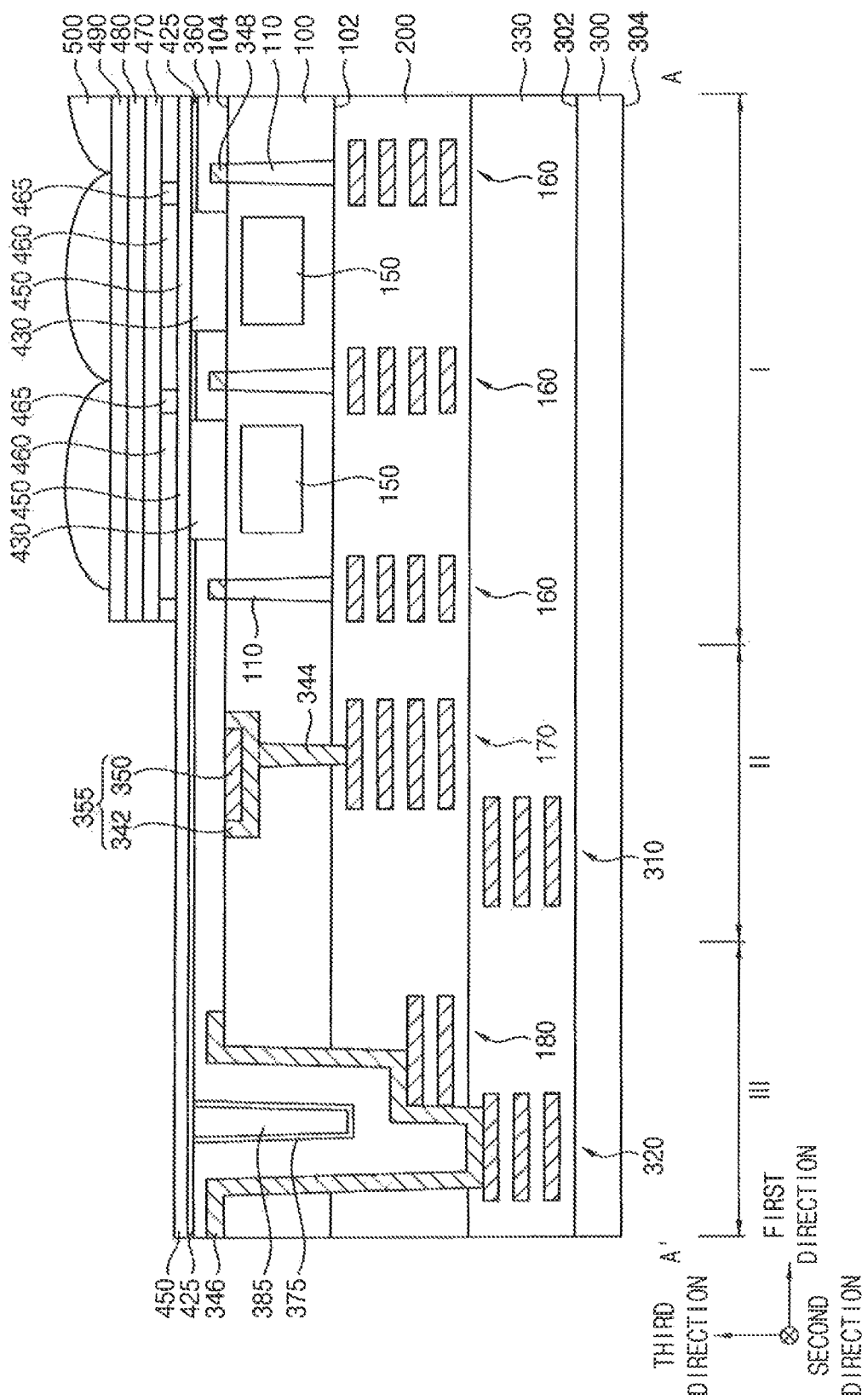
FIG. 21 is a cross-sectional view illustrating a semiconductor device, and more particularly, an image sensor, according to exemplary embodiments of the present inventive concept.

FIG. 21 is a cross-sectional view illustrating a semiconductor device, and more specifically, an image sensor according to exemplary embodiments.

The image sensor illustrated in FIG. 21 may be substantially the same as or similar to the image sensor described with reference to FIGS. 1 to 20, except for the shape of the pad. Accordingly, like reference numerals refer to like elements, and a detailed description of elements and technical features previously described are omitted herein.

Referring to FIG. 21, unlike the pad 355 illustrated in FIG. 19, the pad 355 included in the image sensor of FIG. 21 may be entirely embedded in the first substrate 100.

For example, the second and third conductive patterns 342 and 350 sequentially stacked may be entirely embedded in an upper portion adjacent to the second surface 104 of the first substrate 100, and a lower surface and a sidewall of the third conductive pattern 350 may be covered by the second conductive pattern 342. Further, upper surfaces of the second and third conductive patterns 342 and 350 may be substantially aligned with the second surface 104 of the first substrate 100, such that the upper surfaces of the second and third conductive patterns 342 and 350 do not extend above the second surface 104.

The third via 344 may be formed under the trench 332 in which the second and third conductive patterns 342 and 350 are formed to contact the lower surface of the second conductive pattern 342.

The third insulating interlayer 360 included in the image sensor may have a flat upper surface similar to that of the third insulating interlayer 360 described with reference to FIGS. 19 and 20.

The above semiconductor device may be applied to a contact image sensor (CIS), as well as to various other types of semiconductor devices and systems including insulating interlayers which may cover conductive structures including, for example, volatile memory devices such as DRAM devices, non-volatile memory devices such as flash memory devices, and logic devices.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of manufacturing a semiconductor device, comprising:
   forming a pixel isolation pattern and a through via extending through a substrate in a pixel region, the substrate including the pixel region and an input/output region, and the through via being spaced apart from the pixel isolation pattern,
   wherein the pixel isolation pattern has a lattice shape in which some portions are cut in a plan view, the through via is formed at a cutting portion of the pixel isolation pattern having the lattice shape, the cutting portion is an area cut from the pixel isolation pattern, and the pixel isolation pattern and the through via define a unit pixel region;
   forming a via on an inner wall of a first trench on the substrate in the input/output region, wherein the via comprises a first conductive material;
   forming a first insulating interlayer on the substrate, wherein the first insulating interlayer covers the via and partially fills the first trench, and the first insulating interlayer has a non-flat upper surface;
   forming a polishing stop layer on the first insulating interlayer;
   forming a second insulating interlayer on the polishing stop layer, wherein the second insulating interlayer fills a remaining portion of the first trench;
   planarizing the second insulating interlayer until the polishing stop layer is exposed; and
   etching the polishing stop layer and the first and second insulating interlayers using a dry etching process until remaining portions of the polishing stop layer except for a portion of the polishing stop layer in the first trench are removed.

2. The method of claim 1, wherein the dry etching process is performed using an etching gas of which an etching selectivity between the polishing stop layer and the first and second insulating interlayers is about 0.5:1.5 to about 1.5:0.5.

3. The method of claim 2, wherein the etching gas comprises at least one of fluorocarbon ($CH_4$), fluoroform ($CHF_3$) or oxygen ($O_2$).

4. The method of claim 1, wherein planarizing the second insulating interlayer is performed using a chemical mechanical polishing (CMP) process.

5. The method of claim 4, wherein the CMP process is performed using a slurry of which a polishing selectivity between the second insulating interlayer and the polishing stop layer is about equal to or greater than about 10:1.

6. The method of claim 1, wherein the polishing stop layer comprises a nitride or a carbide.

7. The method of claim 6, wherein the polishing stop layer comprises at least one of silicon nitride (SiN), silicon oxynitride (SiON), silicon carbonitride (SiCN), silicon oxycarbonitride (SiOCN), silicon carbide (SiC), or silicon oxycarbide (SiOC).

8. The method of claim 1, further comprising:
   forming a pad on the substrate in a pad region, the pad region being disposed between the pixel region and the input/output region, wherein the pad comprises a second conductive material; and
   forming an interference prevention pattern on the substrate in the pixel region, wherein the interference prevention pattern comprises a third conductive material,
   wherein the first insulating interlayer covers the pad and the interference prevention pattern.

9. The method of claim 8, wherein the pad fills a second trench on the substrate in the pad region and is formed on an upper surface of the substrate adjacent to the second trench.

10. The method of claim 8, wherein the pad is formed in a second trench on the substrate.

11. The method of claim 8, wherein the interference prevention pattern overlaps the pixel isolation pattern in a direction substantially vertical to an upper surface of the substrate, and the interference prevention pattern does not overlap the substrate in the direction.

12. A method of manufacturing a semiconductor device, comprising:
   forming a pixel isolation pattern and a through via extending through a substrate in a pixel region, the substrate including the pixel region and an input/output region, and the through via being spaced apart from the pixel isolation pattern,
   wherein the pixel isolation pattern has a lattice shape in which some portions are cut in a plan view, the through via is formed at a cutting portion of the pixel isolation pattern having the lattice shape, the cutting portion is an area cut from the pixel isolation pattern, and the pixel isolation pattern and the through via define a unit pixel region;
   forming an opening through the substrate in the input/output region;
   forming a via on an inner wall of the opening;
   forming an interference prevention pattern on an upper surface of the pixel isolation pattern;
   forming a first insulating interlayer on the substrate, wherein the first insulating interlayer covers the via and the interference prevention pattern;
   forming a polishing stop layer on the first insulating interlayer;
   forming a second insulating interlayer on the polishing stop layer, wherein the second insulating interlayer fills a remaining portion of the opening;
   planarizing the second insulating interlayer until the polishing stop layer is exposed; and
   etching the polishing stop layer and the first and second insulating interlayers using a dry etching process.

13. The method of claim 12, wherein the first insulating interlayer covering the via and the interference prevention pattern has a non-flat upper surface before the dry etching process is performed, and the first insulating interlayer covering the via and the interference prevention pattern has a substantially flat upper surface after the dry etching process has been performed.

14. The method of claim 12, wherein the dry etching process is performed until remaining portions of the polishing stop layer except for a portion of the polishing stop layer in the opening are entirely removed.

15. The method of claim 12, wherein the substrate further comprises a pad region disposed between the pixel region and the input/output region,
wherein forming the via and the interference prevention pattern comprises forming a pad on the substrate in the pad region, and the first insulating interlayer covers the pad.

16. The method of claim 15, wherein forming the pad comprises forming a contact plug,
wherein the contact plug extends through the substrate and is connected to the pad.

17. The method of claim 12, wherein the interference prevention pattern does not overlap the substrate in a direction substantially vertical to an upper surface of the substrate.

18. A method of manufacturing a semiconductor device, comprising:
forming a pixel isolation pattern and a through via extending through a substrate in a pixel region, the substrate including the pixel region and an input/output region and a first surface and a second surface disposed opposite to the first surface, and the through via being spaced apart from the pixel isolation pattern,
wherein the pixel isolation pattern has a lattice shape in which some portions are cut in a plan view, the through via is formed at a cutting portion of the pixel isolation pattern having the lattice shape, the cutting portion is an area cut from the pixel isolation pattern, and the pixel isolation pattern and the through via define a unit pixel region;
forming a first insulating interlayer on the first surface of the substrate, wherein the first insulating interlayer comprises a plurality of wiring structures;
forming an opening through the substrate in the input/output region, wherein the opening exposes at least one of the wiring structures;
forming a via on the exposed at least one of the wiring structures and a sidewall of the opening;
forming an interference prevention pattern on an upper surface of the pixel isolation pattern adjacent to the second surface of the substrate;
forming a second insulating interlayer on the second surface of the substrate, wherein the second insulating interlayer covers the via and the interference prevention pattern;
forming a polishing stop layer on the second insulating interlayer;
forming a third insulating interlayer on the polishing stop layer, wherein the third insulating interlayer fills a remaining portion of the opening;
planarizing the third insulating interlayer until the polishing stop layer is exposed; and
etching the polishing stop layer and the second and third insulating interlayers using a dry etching process.

19. The method of claim 18, wherein the through via is electrically connected to at least one of the wiring structures through a first contact plug disposed on the first insulating interlayer.

20. The method of claim 19, wherein a portion of the second insulating interlayer remains on the substrate in the pixel region after performing the dry etching process, and the method further comprises:
forming a second contact plug through the second insulating interlayer, wherein the second contact plug is connected to the through via; and
forming an organic photodiode, wherein the organic photodiode contacts the second contact plug.

* * * * *